(12) United States Patent
Liu et al.

(10) Patent No.: US 12,446,287 B2
(45) Date of Patent: Oct. 14, 2025

(54) SEMICONDUCTOR DEVICE AND METHOD FOR MANUFACTURING THE SAME

(71) Applicant: INNOSCIENCE (SUZHOU) SEMICONDUCTOR CO., LTD., Suzhou (CN)

(72) Inventors: Yang Liu, Suzhou (CN); Liang Chen, Suzhou (CN); Xiao Zhang, Suzhou (CN); Haoning Zheng, Suzhou (CN); King Yuen Wong, Suzhou (CN)

(73) Assignee: INNOSCIENCE (SUZHOU) SEMICONDUCTOR CO., LTD., Suzhou (CN)

( * ) Notice: Subject to any disclaimer, the term of this patent is extended or adjusted under 35 U.S.C. 154(b) by 0 days.

(21) Appl. No.: 17/775,879

(22) PCT Filed: Mar. 29, 2022

(86) PCT No.: PCT/CN2022/083542
§ 371 (c)(1),
(2) Date: May 10, 2022

(87) PCT Pub. No.: WO2023/184129
PCT Pub. Date: Oct. 5, 2023

(65) Prior Publication Data
US 2024/0154012 A1 May 9, 2024

(51) Int. Cl.
*H01L 29/423* (2006.01)
*H01L 29/20* (2006.01)
(Continued)

(52) U.S. Cl.
CPC ......... *H10D 64/411* (2025.01); *H10D 30/015* (2025.01); *H10D 30/475* (2025.01); *H10D 62/8503* (2025.01); *H10D 64/01* (2025.01)

(58) Field of Classification Search
None
See application file for complete search history.

(56) References Cited

U.S. PATENT DOCUMENTS

| 7,800,155 B2 * | 9/2010 | Matsuno | H01L 21/7682 257/E21.666 |
| 11,670,689 B2 * | 6/2023 | Tseng | H01L 29/407 257/508 |

(Continued)

FOREIGN PATENT DOCUMENTS

| CN | 112740418 A | 4/2021 |
| JP | 2007142208 A | 6/2007 |

(Continued)

OTHER PUBLICATIONS

ISA State Intellectual Property Office of the People's Republic of China, International Search Report Issued in Application No. PCT/CN2022/083542, Dec. 27, 2022, WIPO, 4 pages.
(Continued)

*Primary Examiner* — Michael Lebentritt
(74) *Attorney, Agent, or Firm* — McCoy Russell LLP

(57) ABSTRACT

A semiconductor device includes a first and a second nitride-based semiconductor layers and a gate structure. The gate structure includes an outer spacer, an inner spacer and a gate electrode. The outer spacer has at least two opposite inner sidewalls to define a gate trench. The inner spacer is within the gate trench. The gate electrode disposed in the gate trench and covered by the inner spacer, wherein the inner spacer and the gate electrode extend downward to collaboratively form a bottom portion of the gate structure with a first width greater than a second width of a bottom surface of the gate electrode.

19 Claims, 23 Drawing Sheets

(51) Int. Cl.
*H01L 29/40* (2006.01)
*H01L 29/66* (2006.01)
*H01L 29/778* (2006.01)
*H10D 30/01* (2025.01)
*H10D 30/47* (2025.01)
*H10D 62/85* (2025.01)
*H10D 64/01* (2025.01)
*H10D 64/27* (2025.01)

(56) References Cited

U.S. PATENT DOCUMENTS

| | | | |
|---|---|---|---|
| 2013/0032888 A1* | 2/2013 | Murata | H01L 29/7843 257/E21.409 |
| 2015/0028388 A1 | 1/2015 | Majumdar et al. | |
| 2015/0187763 A1* | 7/2015 | Kim | H01L 29/518 257/368 |
| 2015/0243773 A1 | 8/2015 | Basu et al. | |
| 2017/0104093 A1* | 4/2017 | Takado | H01L 29/66462 |
| 2017/0301765 A1* | 10/2017 | Tsuchiya | H10D 62/824 |
| 2017/0352675 A1* | 12/2017 | Mihara | H01L 29/7855 |
| 2019/0355843 A1 | 11/2019 | Then et al. | |
| 2020/0194575 A1 | 6/2020 | Ramaswamy et al. | |
| 2023/0031437 A1* | 2/2023 | Chen | H01L 29/7781 |

FOREIGN PATENT DOCUMENTS

| | | |
|---|---|---|
| KR | 20050039088 A | 4/2005 |
| KR | 20090064746 A | 6/2009 |

OTHER PUBLICATIONS

ISA State Intellectual Property Office of the People's Republic of China, Written Opinion of the International Searching Authority Issued in Application No. PCT/CN2022/083542, Dec. 27, 2022, WIPO, 4 pages.

State Intellectual Property Office of the People's Republic of China, Office Action and Search Report Issued in Application No. 202280004813.0, Aug. 19, 2025, 17 pages. (Submitted with Machine Translation).

* cited by examiner

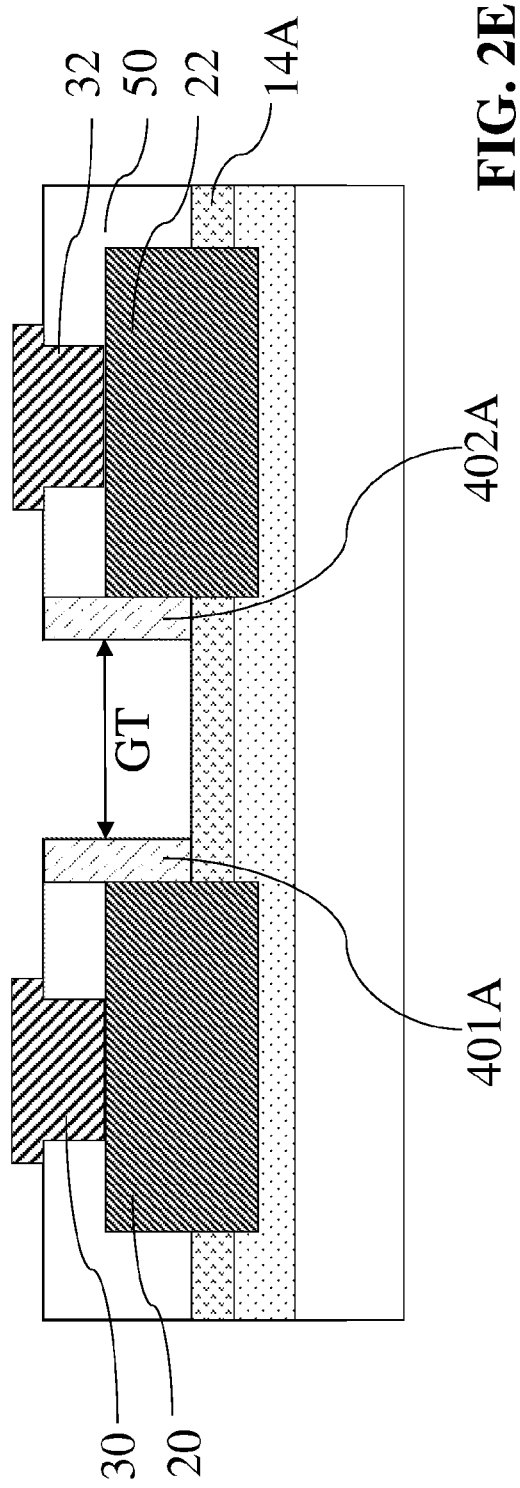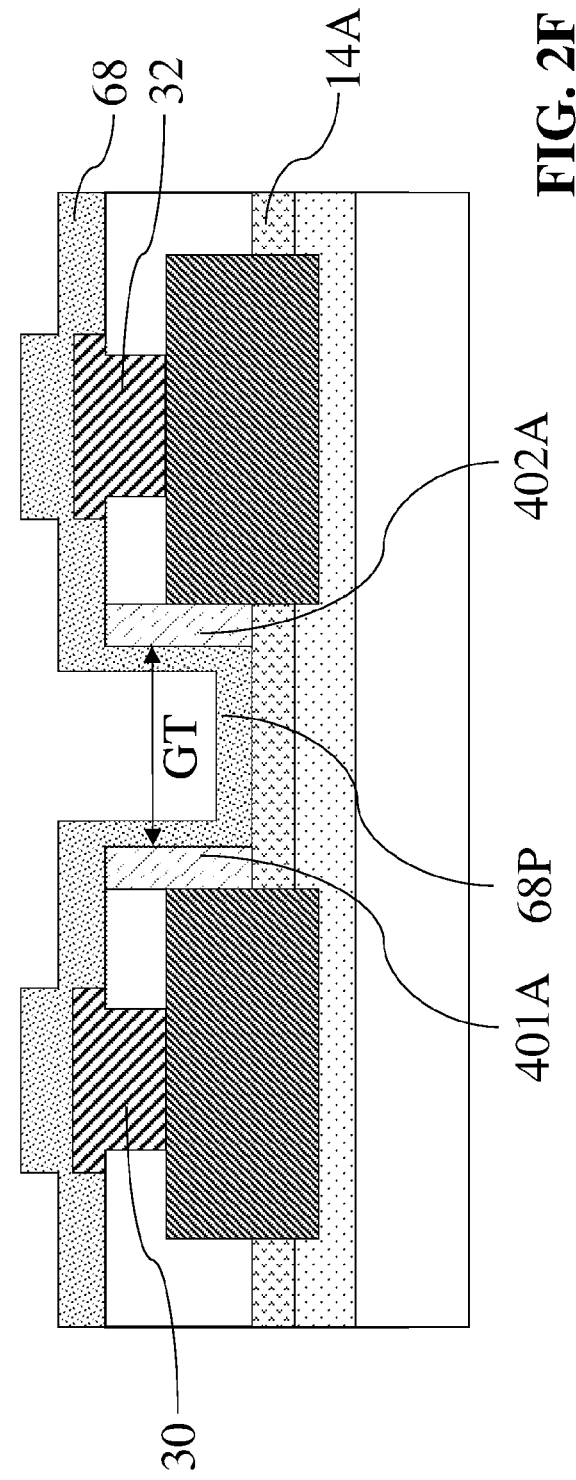

SEMICONDUCTOR DEVICE AND METHOD FOR MANUFACTURING THE SAME

FIELD OF THE DISCLOSURE

The present disclosure generally relates to a nitride-based semiconductor device. More specifically, the present disclosure relates to a nitride-based semiconductor device having a gate trench.

BACKGROUND OF THE DISCLOSURE

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET).

SUMMARY OF THE DISCLOSURE

In accordance with one aspect of the present disclosure, a semiconductor device is provided. The semiconductor device includes a first nitride-based semiconductor layer, a second nitride-based semiconductor layer, and a gate structure. The second nitride-based semiconductor layer is disposed over the first nitride-based semiconductor layer. The second nitride-based semiconductor layer has a bandgap greater than that of the first nitride-based semiconductor layer. The gate structure is disposed over the first nitride-based semiconductor layer. The gate structure includes an outer spacer, an inner spacer, and a gate electrode. The outer spacer is disposed over the second nitride-based semiconductor layer and has at least two opposite inner sidewalls to define a gate trench. The inner spacer is disposed over the first nitride-based semiconductor layer and within the gate trench. The gate electrode is disposed in the gate trench and covered by the inner spacer. At least the inner spacer and the gate electrode extend downward to collaboratively form a bottom portion of the gate structure with a first width greater than a second width of a bottom surface of the gate electrode.

In accordance with one aspect of the present disclosure, a method for manufacturing a semiconductor device is provided. The method includes steps as follows. A first nitride-based semiconductor layer is formed. A second nitride-based semiconductor layer is formed over the first nitride-based semiconductor layer. The second nitride-based semiconductor layer has a bandgap greater than that of the first nitride-based semiconductor layer. A dummy gate is formed on the second nitride-based semiconductor layer. A blanket spacer layer is formed to cover the dummy gate. A portion of the blanket spacer layer is removed to expose the dummy gate, and at least a portion of the blanket spacer layer is remained at an outer sidewall of the dummy gate to serve as an outer spacer. The dummy gate is removed to form a gate trench. An inner spacer is formed in the gate trench. A gate electrode is formed in the gate trench, such that a width of a bottom portion of the gate electrode is less than a width of the gate trench.

In accordance with one aspect of the present disclosure, a semiconductor device is provided. The semiconductor device includes a first nitride-based semiconductor layer, a second nitride-based semiconductor layer, an outer spacer, an inner spacer, and a gate electrode. The second nitride-based semiconductor layer is disposed over the first nitride-based semiconductor layer. The second nitride-based semiconductor layer has a bandgap greater than that of the first nitride-based semiconductor layer. The outer spacer is disposed over the first nitride-based semiconductor layer and defines a gate trench. The inner spacer is disposed over the first nitride-based semiconductor layer and within the gate trench. The inner spacer extends downward in an extending length greater than a thickness of the outer spacer. The gate electrode disposed in the gate trench, wherein the inner spacer is located between the outer spacer and the gate electrode.

In accordance with one aspect of the present disclosure, a semiconductor device is provided. The semiconductor device includes a first nitride-based semiconductor layer, a second nitride-based semiconductor layer, a source electrode, a drain electrode and a gate structure. The second nitride-based semiconductor layer is disposed over the first nitride-based semiconductor layer. The second nitride-based semiconductor layer has a bandgap greater than that of the first nitride-based semiconductor layer. The source electrode and the drain electrode are disposed over the first nitride-based semiconductor layer. The gate structure is disposed over the first nitride-based semiconductor layer and confined between the source electrode and the drain electrode. The gate structure includes a gate spacer layer, an etching stop layer, and a gate electrode. The gate spacer layer is disposed over the second nitride-based semiconductor layer. The etching stop layer is disposed between the gate spacer layer and the second nitride-based semiconductor layer and defining a gate trench with the gate spacer layer collectively. The gate electrode is disposed in the gate trench.

In accordance with one aspect of the present disclosure, a method for manufacturing a semiconductor device is provided. The method includes steps as follows. A first nitride-based semiconductor layer is formed. A second nitride-based semiconductor layer is formed over the first nitride-based semiconductor layer. The second nitride-based semiconductor layer has a bandgap greater than that of the first nitride-based semiconductor layer. A blanket etching stop layer is formed over the second nitride-based semiconductor layer. A dummy gate is formed over the blanket etching stop layer. A blanket spacer layer is formed to cover the dummy gate and the blanket etching stop layer. A portion of the blanket spacer layer is removed to expose the dummy gate. At least a portion of the blanket spacer layer is removed to expose the dummy gate, and at least a portion of the blanket spacer layer is remained at an outer sidewall of the dummy gate to serve as a gate spacer layer. A first etching process is performed to remove the dummy gate such that the blanket etching stop layer is exposed. A second etching process is performed to remove at least one portion of the blanket etching stop layer such that a gate trench exposing one of the first and second nitride-based semiconductor layers is formed. A gate electrode is formed in the gate trench.

In accordance with one aspect of the present disclosure, a semiconductor device is provided. The semiconductor device includes a first nitride-based semiconductor layer, a second nitride-based semiconductor layer, and a gate structure. The second nitride-based semiconductor layer is disposed over the mesa portion of the first nitride-based semiconductor layer. The second nitride-based semiconductor layer has a bandgap greater than that of the first nitride-based semiconductor layer. The gate structure is disposed over the first nitride-based semiconductor layer. The gate structure includes a gate spacer layer, an etching stop layer, a gate electrode and two doped nitride-based semiconductor layers. The gate spacer layer is disposed over the second nitride-based semiconductor layer. The etching stop layer is disposed between the gate spacer layer and the second nitride-based semiconductor layer and defines a gate trench with the gate spacer layer collectively. The gate electrode disposed in the gate trench. The two doped nitride-based semiconductor layers are located at two opposite sides of the gate structure, respectively. Each of the doped nitride-based semiconductor layers extends horizontally/laterally to outer sidewalls of the gate spacer layer and the etching stop layer, such that the gate electrode is separated from the two doped nitride-based semiconductor layers by the gate spacer layer and the etching stop layer.

By the above configuration, in the present disclosure, the semiconductor device can achieve a better performance with a lower manufacturing cost by modifying the gate structure thereof.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which:

FIG. 2A, FIG. 2B, FIG. 2C, FIG. 2D, FIG. 2E, FIG. 2F, FIG. 2G, and FIG. 2H show different stages of a method for manufacturing a semiconductor device according to some embodiments of the present disclosure;

DETAILED DESCRIPTION

Figure 1:
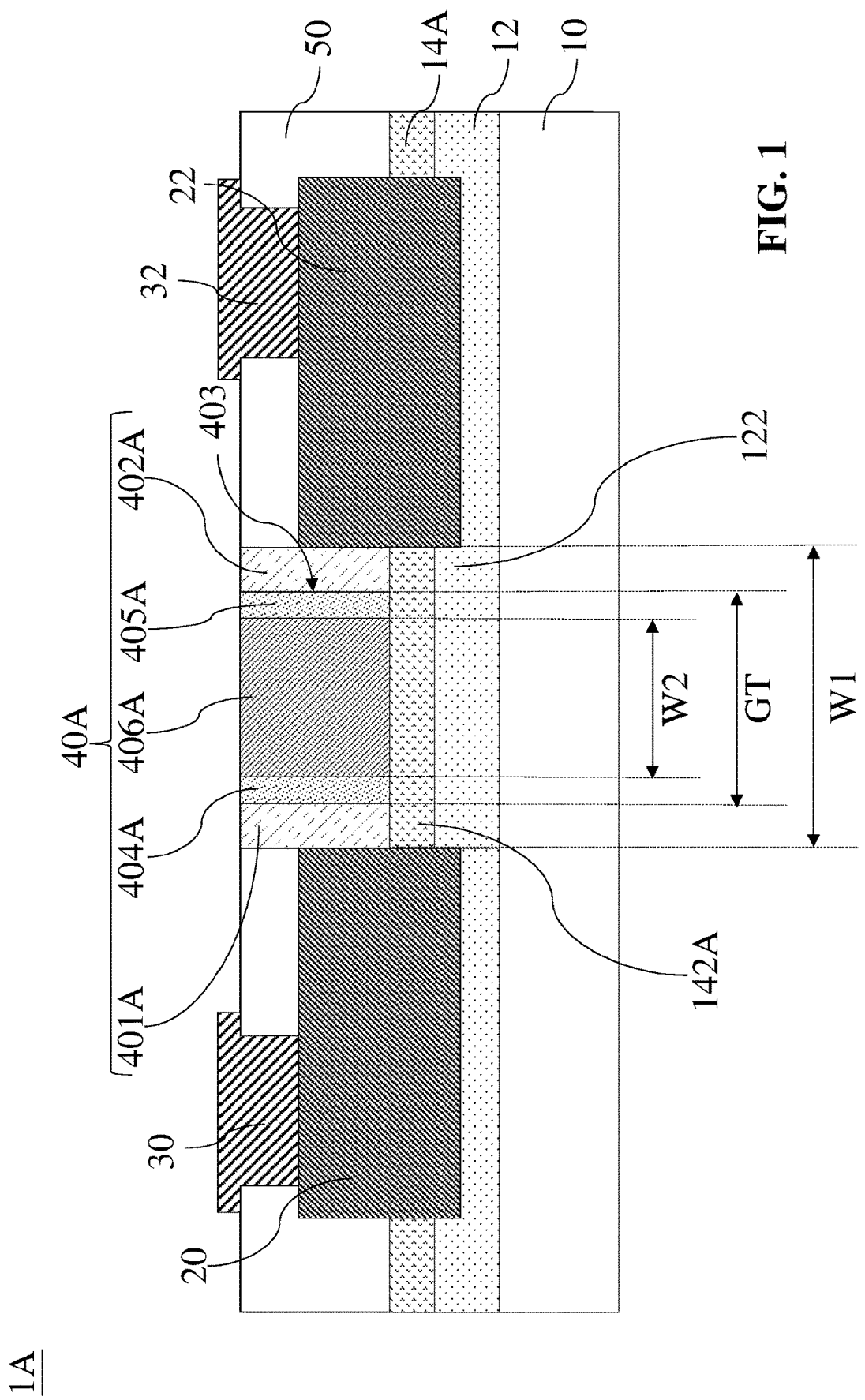
FIG. 1 is a vertical cross-sectional view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "on," "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

FIG. 1 is a vertical view of a semiconductor device 1A according to some embodiments of the present disclosure. The semiconductor device 1A includes a substrate 10, nitride-based semiconductor layers 12, 14A, doped nitride-based semiconductor layers 20, 22, electrodes 30, 32, a gate structure 40A, and a passivation layer 50.

The substrate 10 may be a semiconductor substrate. The exemplary materials of the substrate 10 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 10 can include, for example, but is not limited to, group III elements, group IV elements, group V elements, or combinations thereof (e.g., III-V compounds). In other embodiments, the substrate 10 can include, for example but is not limited to, one or more other features, such as a doped region, a buried layer, an epitaxial (epi) layer, or combinations thereof.

In some embodiments, the semiconductor device 1A may further include a buffer layer (not shown). The buffer layer can be disposed on/over/above the substrate 10. The buffer layer can be disposed between the substrate 10 and the nitride-based semiconductor layer 12. The buffer layer can be configured to reduce lattice and thermal mismatches between the substrate 10 and the nitride-based semiconductor layer 12, thereby curing defects due to the mismatches/difference. The buffer layer may include a III-V compound. The III-V compound can include, for example but are not limited to, aluminum, gallium, indium, nitrogen, or combinations thereof. Accordingly, the exemplary materials of the buffer layer can further include, for example but are not limited to, GaN, AlN, AlGaN, InAlGaN, or combinations thereof.

In some embodiments, the semiconductor device 1A may further include a nucleation layer (not shown). The nucleation layer may be formed between the substrate 10 and the buffer layer. The nucleation layer can be configured to provide a transition to accommodate a mismatch/difference between the substrate 10 and a III-nitride layer of the buffer layer. The exemplary material of the nucleation layer can include, for example but is not limited to AlN or any of its alloys.

The nitride-based semiconductor layer 12 can be disposed on/over/above the substrate 10. The nitride-based semiconductor layer 14A can make contact with the substrate 10. The nitride-based semiconductor layer 14A can be disposed on/over/above the nitride-based semiconductor layer 12. The exemplary materials of the nitride-based semiconductor layer 12 can include, for example but are not limited to, nitrides or group III-V compounds, such as GaN, AlN, InN, $In_xAl_yGa_{(1-x-y)}N$ where $x+y\leq 1$, $Al_yGa_{(1-y)}N$ where $y\leq 1$. The exemplary materials of the nitride-based semiconductor layer 14A can include, for example but are not limited to, nitrides or group III-V compounds, such as GaN, AlN, InN, $In_xAl_yGa_{(1-x-y)}N$ where $x+y\leq 1$, $Al_yGa_{(1-y)}N$ where $y\leq 1$.

The exemplary materials of the nitride-based semiconductor layers 12 and 14A are selected such that the nitride-based semiconductor layer 14A has a bandgap (i.e., forbidden band width) greater/higher than a bandgap of the nitride-based semiconductor layer 12, which causes electron affinities thereof different from each other and forms a heterojunction therebetween. For example, when the nitride-based semiconductor layer 12 is an undoped GaN layer having a bandgap of approximately 3.4 eV, the nitride-based semiconductor layer 14A can be selected as an AlGaN layer having bandgap of approximately 4.0 eV. As such, the nitride-based semiconductor layers 12 and 14A can serve as a channel layer and a barrier layer, respectively. A triangular well potential is generated at a bonded interface between the channel and barrier layers, so that electrons accumulate in the triangular well, thereby generating a two-dimensional electron gas (2DEG) region adjacent to the heterojunction. Accordingly, the semiconductor device 1A is available to include at least one GaN-based high-electron-mobility transistor (HEMT).

Each of the doped nitride-based semiconductor layers 20 and 22 can penetrate the nitride-based semiconductor layer 14A and extend into the nitride-based semiconductor layer 12, such that portions 122, 142A of the nitride-based semiconductor layers 12 and 14A are sandwiched between the doped nitride-based semiconductor layers 20 and 22.

The doped nitride-based semiconductor layers 20 and 22 can be a n-type doped III-V semiconductor layer. The exemplary materials of the doped nitride-based semiconductor layers 20, 22 can include, for example but are not limited to, n-doped group III-V nitride semiconductor materials, such as n-type GaN, n-type AlGaN, n-type InN, n-type AlInN, n-type InGaN, n-type AlInGaN, or combinations thereof. In some embodiments, the n-doped materials are achieved by using a n-type impurity/dopant, such as silicon (Si) or germanium (Ge). In some embodiments, each of the doped nitride-based semiconductor layers 20 and 22 can be heavily n-doped in order to decrease contact resistance. In some embodiments, the doping concentration of the n-type impurities/dopants can be in a range from $5*10^{18}$ cm$^{-3}$ to $5*10^{20}$ cm$^{-3}$.

The electrodes 30 and 32 are disposed on/over/above the nitride-based semiconductor layer 12. The electrodes 30 and 32 are disposed on/over/above the doped nitride-based semiconductor layers 20 and 22, respectively. The electrodes 30, 32 can make contact with the doped nitride-based semiconductor layers 20, 22, respectively. The regions where the doped nitride-based semiconductor layers 20, 22 are located can be defined as electrode regions. In some embodiments, the electrode 30 can serve as a source electrode. In some embodiments, the electrode 30 can serve as a drain electrode. In some embodiments, the electrode 32 can serve as a source electrode. In some embodiments, the electrode 32 can serve as a drain electrode. The role of the electrodes 30 and 32 depends on the device design.

In some embodiments, the electrodes 30 and 32 can include, for example but are not limited to, metals, alloys, doped semiconductor materials (such as doped crystalline silicon), compounds such as silicides and nitrides, other conductor materials, or combinations thereof. The exemplary materials of the electrodes 30 and 32 can include, for example but are not limited to, Ti, AlSi, TiN, or combinations thereof. Each of the electrodes 30 and 32 may be a single layer, or plural layers of the same or different composition. The electrodes 30 and 32 form ohmic contacts with the nitride-based semiconductor layer 14A. Furthermore, the ohmic contacts can be achieved by applying Ti, Al, or other suitable materials to the electrodes 30 and 32. In some embodiments, each of the electrodes 30 and 32 is formed by at least one conformal layer and a conductive filling. The conformal layer can wrap the conductive filling. The exemplary materials of the conformal layer can include, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

HEMT devices have been applied to various fields. With respect different requirements, device parameters will be turned for complying with device conditions. For example, gate length (i.e., channel length) can be adapted to match different purposes for devices. There is a need for a manner to reduce channel length. In order to reduce channel length, expensive and highly required photolithographic equipment is applied during fabrication processes for device, resulting in highly manufacturing cost thereof. Moreover, the shrink of the gate length would make the exposure and etching processes more complex.

At least to avoid the aforesaid issue, the present disclosure is to develop a novel structure for semiconductor devices.

The gate structure 40A is disposed on/over/above the portion 122 of the nitride-based semiconductor layer 12 and the portion 142A of the nitride-based semiconductor layer 14A. The gate structure 40A makes contact with the portion 142A of the nitride-based semiconductor layer 14A, and thus the region where the portion 142A of the nitride-based semiconductor layer 14A is located can be defined as a gate region. The gate structure 40A is disposed/located between the electrodes 30, 32 (or the doped nitride-based semiconductor layers 20, 22). The gate structure 40A includes an outer spacer including portions 401A and 402A, an inner spacer including portions 404A and 405A, and a gate electrode 406A. The detailed configuration of the gate structure 40A will be fully described as follows.

The portions 401A and 402A of the outer spacer are disposed on/over/above the portion 122 of the nitride-based semiconductor layer 12 and the portion 142A of the nitride-based semiconductor layer 14A. The portions 401A and 402A are separated from each other by the portions 404A, 405A of the inner spacer and the gate electrode 406A. Each of the portions 401A and 402A extends downward to make contact with the portion 142A of the nitride-based semiconductor layer 14A. The portions 401A and 402A of the outer spacer respectively include opposite inner sidewalls 403 to define a gate trench GT.

The doped nitride-based semiconductor layer 20 abuts against the portion 401A of the outer spacer, the portion 142A of the nitride-based semiconductor layer 14A, and the portion 122 of the nitride-based semiconductor layer 12. An entirety of a bottom surface of the doped nitride-based semiconductor layer 20 is in a position under the portion 401A of the inner spacer. The doped nitride-based semiconductor layer 22 abuts against the portion 402A of the outer spacer, the portion 142A of the nitride-based semiconductor layer 14A, and the portion 122 of the nitride-based semiconductor layer 12. An entirety of a bottom surface of the doped nitride-based semiconductor layer 22 is in a position under the portion 402A of the inner spacer.

The portions 404A and 405A of the inner spacer are disposed on/over/above the portion 122 of the nitride-based semiconductor layer 12 and the portion 142A of the nitride-based semiconductor layer 14. The portions 404A and 405A of the inner spacer are separated from each other by the gate electrode 406A. Each of the portions 404A and 405A extends downward to make contact with the portion 142A of the nitride-based semiconductor layer 14. Each of the portions 404A and 405A has a bottom end surface in contact with the nitride-based semiconductor layer 14A. The portions 404A and 405A of the inner spacer are connected to two opposite inner sidewalls 403 of the outer spacer, respectively. An entirety of each the inner sidewalls 403 of the outer spacer is covered by the portion 404A or 405A of the inner spacer. Each of the doped nitride-based semiconductor layer 20 and 22 has a bottom surface that is entirely in a position under the portions 404A and 405A of the inner spacer.

The portions 404A and 405A of the inner spacer and the gate electrode 406A are disposed in the gate trench GT. The gate electrode 406A is covered by the inner spacer. The opposite side surfaces of the gate electrode 406A are covered by the portions 404A and 405A of the inner spacer. The gate electrode 406A is located between the portions 404A and 405A of the inner spacer.

The portion 404A of the inner spacer is located/disposed between the portion 401A of the outer spacer and the gate electrode 406A, such that the gate electrode 406A is separated from the portion 401A of the outer spacer by the portion 404A of the inner spacer. The portion 405A of the inner spacer is located/disposed between the portion 402A of the outer spacer and the gate electrode 406A, such that the gate electrode 406A is separated from the portion 402A of the outer spacer by the portion 405A of the inner spacer. The outer spacer, the inner spacer, and the gate electrode 406A extend downward to collaboratively form a bottom portion of the gate structure 40A with a width W1. The width W1 of the bottom portion of the gate structure 40A is greater than a width W2 of a bottom surface of the gate electrode 406A. In the present embodiment, each extending length of the portions 404A and 405A of the inner spacer is substantially the same as each thickness of the portions 401A and 402A of the outer spacer.

By the above configuration, since the portions 404A and 405A of the inner spacer and the gate electrode 406A can collectively fill up the gate trench GT, a part of the gate trench GT is at least occupied by the portions 404A and 405A of the inner spacer, thereby defining the width W2 of the gate electrode 406A as being less than the width W1 of the bottom portion of the gate structure 40A (or the width of the gate trench GT). Hence, an effect of reducing gate length without applying expensive equipment can be achieved. The manufacturing cost of the semiconductor device 1A can be greatly reduced. The electrical properties of the semiconductor device 1A can be improved, such as current gain cutoff frequency, maximum frequency of oscillation, output conductance, gate-source capacitance, so that the semiconductor device 1A can have a good performance due to reduced gate length. Therefore, the semiconductor device 1A can comply with high frequency requirements.

Also, the doped nitride-based semiconductor layers 20 and 22 are separated from the gate electrode 406A by the outer and inner spacers. The outer and inner spacers can collectively provide a good insulation between the doped nitride-based semiconductor layer 20 and the gate electrode 406A and between the doped nitride-based semiconductor layer 22 and the gate electrode 406A, such that gate leakage can be significantly reduced.

Moreover, each of the portions 401A and 402A of the outer spacer has a width that is substantially constant. The width of the portion 401A is substantially the same as the width of the portion 402A. Each of the portions 404A and 405A of the inner spacer has a width that is substantially constant. The width of the portion 404A is substantially the same as the width of the portion 405A. The width of each of the portions 401A and 402A of the outer spacer is greater than that of each of the portions 404A and 405A of the inner spacer. The gate electrode 406A is wider than each of the portions 404A and 405A of the inner spacer.

In some embodiments, the relationship among the widths of the portions 401A, 402A of the outer spacer, the portions 404A, 405A of the inner spacer, and the gate electrode 406A can be altered, so as to manufacture semiconductor devices with different electrical properties. These width parameters can be further fine-tuned, which is advantageous to provide more design flexibility.

The exemplary materials of the outer spacer and the inner spacer can include, for example but are not limited to, dielectric materials. For example, the dielectric materials can include, for example but are not limited to, $SiN_x$, $SiO_x$, Si₃N₄, SiON, SiC, SiBN, SiCBN, oxides, nitrides, plasma enhanced oxide (PEOX), or combinations thereof.

The exemplary materials of the gate electrode 406A may include metals or metal compounds. The gate electrode 406A may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, metal alloys or compounds thereof, or other metallic compounds.

The passivation layer 50 covers the nitride-based semiconductor layer 14A and the doped nitride-based semiconductor layers 20, 22. The exemplary material of the passivation layer 50 can include, for example but are not limited to, dielectric materials. For example, the dielectric materials can include, for example but are not limited to, $SiN_x$, $SiO_x$, $Si_3N_4$, SiON, SiC, SiBN, SiCBN, oxides, nitrides, plasma enhanced oxide (PEOX), or combinations thereof.

Different stages of a method for manufacturing the semiconductor device 1A are shown in FIG. 2A, FIG. 2B, FIG. 2C, FIG. 2D, FIG. 2E, FIG. 2F, FIG. 2G and FIG. 2H, as described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figure 2A:
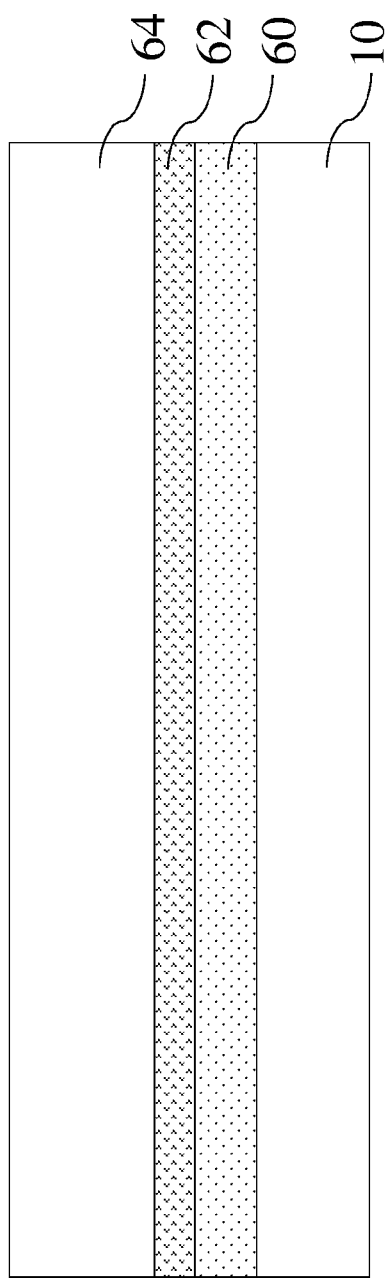

Referring to FIG. 2A, a substrate 10 is provided. Blanket nitride-based semiconductor layers 60 and 62 can be formed on/over/above the substrate 10 in sequence by using deposition techniques. A blanket dielectric layer 64 can be formed on/over/above the blanket nitride-based semiconductor layer 62. The formation of the blanket nitride-based semiconductor layers 60 and 62, and the blanket dielectric layer 64 can include deposition techniques. In some embodiments, the deposition techniques can be performed for forming a blanket layer.

Figure 2B:
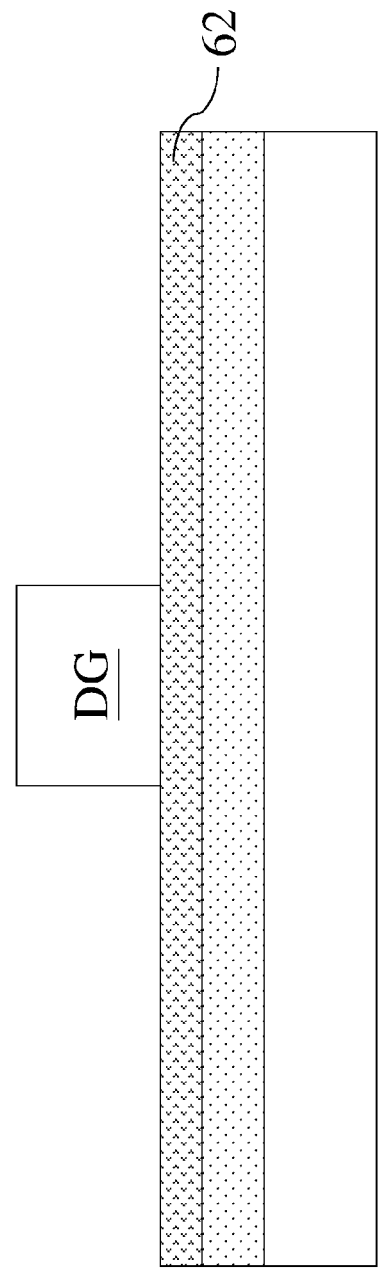

Referring to FIG. 2B, a patterning process can be performed on the blanket dielectric layer 64, such that excess portions thereof can be removed, thereby remaining at least a portion of the blanket dielectric layer 64 on the blanket nitride-based semiconductor layer 62. The remained portion of the blanket dielectric layer 64 can serve as a dummy gate DG. Thus, the dummy gate DG is formed on the blanket nitride-based semiconductor layer 62.

Figure 2C:
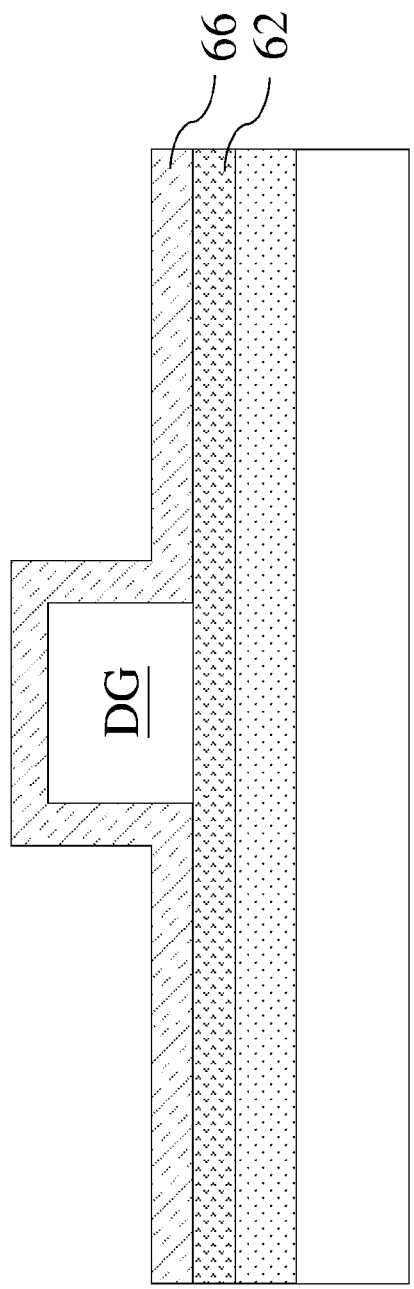

Referring to FIG. 2C, a blanket spacer layer 66 is formed to cover the dummy gate DG and a top surface of the blanket nitride-based semiconductor layer 62.

Figure 2D:
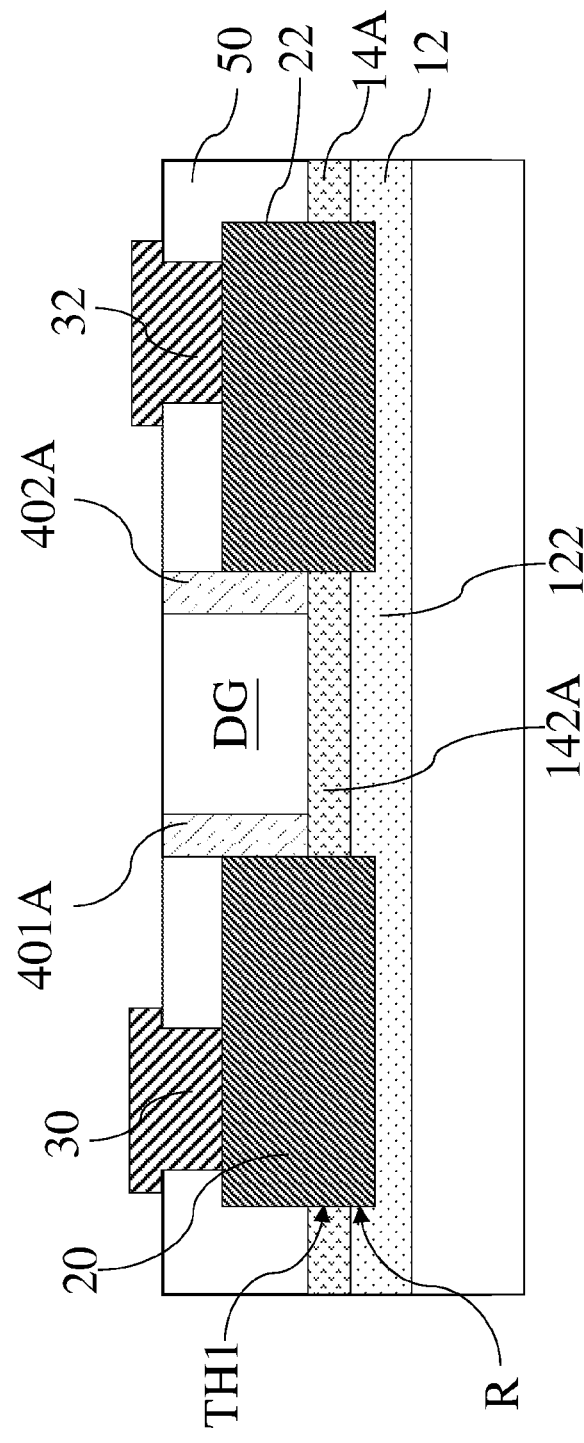

Referring to FIG. 2D, a portion of the blanket spacer layer 66 is removed to expose a portion of the blanket nitride-based semiconductor layer 62. Then, the blanket nitride-based semiconductor layers 60 and 62 are patterned, such that a nitride-based semiconductor layer 14A with two through holes TH1 and a nitride-based semiconductor layer 12 with two recesses R can be formed. The two recesses R are aligned with the two through holes TH1, respectively.

After that, the doped nitride-based semiconductor layers 20 and 22 are formed in the through holes TH1 and recesses R. Each of the doped nitride-based semiconductor layers 20 and 22 can penetrate the nitride-based semiconductor layer 14A. Each of the doped nitride-based semiconductor layers 20 and 22 can extend into the nitride-based semiconductor layer 12. The portion 142A of the nitride-based semiconductor layer 14A and the portion 122 of the nitride-based semiconductor layer 12 can be well defined between the doped nitride-based semiconductor layers 20 and 22.

Next, another portion of the blanket spacer layer 66 is removed to expose a top surface of the dummy gate DG, and some portions of the blanket spacer layer 66 are remained at two opposite outer sidewalls of the dummy gate DG to serve as the portions 401A and 402A of an outer spacer. Then, a blanket passivation layer is formed to cover the nitride-based semiconductor layer 14A, the doped nitride-based semiconductor layers 20 and 22, the portions 401A and 402A, and the dummy gate DG. In some embodiments, excess portions of the blanket passivation layer are removed, thereby exposing top surfaces of the portions 401A and 402A, and the dummy gate DG.

After that, an etching process is performed on the blanket passivation layer form a plurality of through holes to expose top surfaces of the doped nitride-based semiconductor layers 20 and 22. Thus, a passivation layer 50 is formed. The passivation layer 50 is formed to cover the nitride-based semiconductor layer 14A, and the doped nitride-based semiconductor layers 20 and 22. Then, the blanket electrode layer is formed to cover the resulted structure, such that portions of the blanket electrode layer fills up the through holes of the passivation layer 50. The blanket electrode layer is formed to make contact with the doped nitride-based semiconductor layers 20 and 22 through the through holes of the passivation layer 50. An etching process is performed on the blanket electrode layer to remove the excess portions thereof, thereby forming electrodes 30, 32 with T-shaped profile. The electrodes 30 and 32 are formed on/over/above the doped nitride-based semiconductor layers 20 and 22, respectively.

In order to achieve different electrical properties of the semiconductor device, in some embodiments, the electrodes 30, 32 can be formed to have a rectangular profile.

Referring to FIG. 2E, a dummy gate DG is removed to form a gate trench GT between the portions 401A and 402A of an outer spacer.

Referring to FIG. 2F, a blanket spacer layer 68 is formed to cover the resulted structure of FIG. 2E, such that a portion 68P of the blanket spacer layer 68 is formed to extend into the gate trench GT. The portion 68P is conformal with a profile constituted by the portions 401A and 402A of the outer spacer, and a nitride-based semiconductor layer 14A.

Figure 2G:
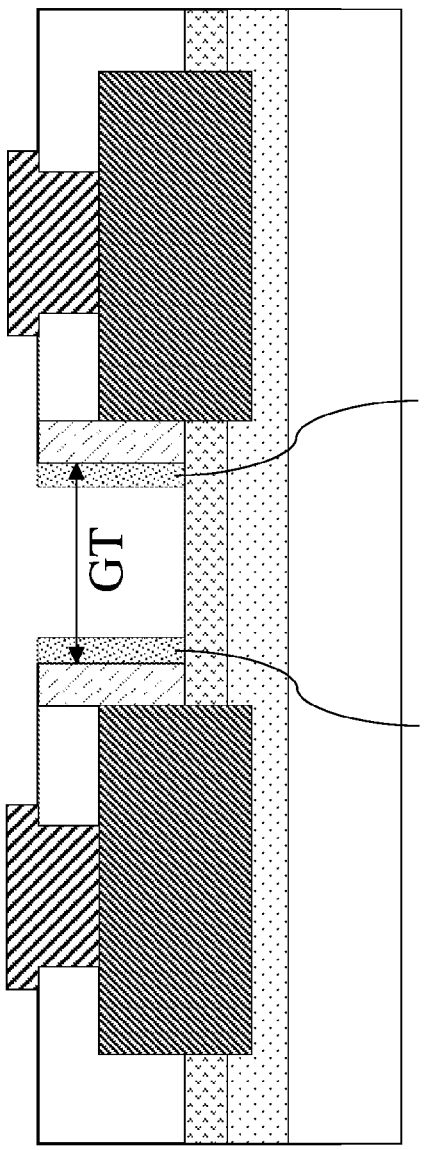

Referring to FIG. 2G, a patterning process is performed on the blanket spacer layer 68, so as to remove excess portions of the blanket spacer layer 68, thereby forming the portions 404A, 405A of the inner spacer in the gate trench GT.

Figure 2H:
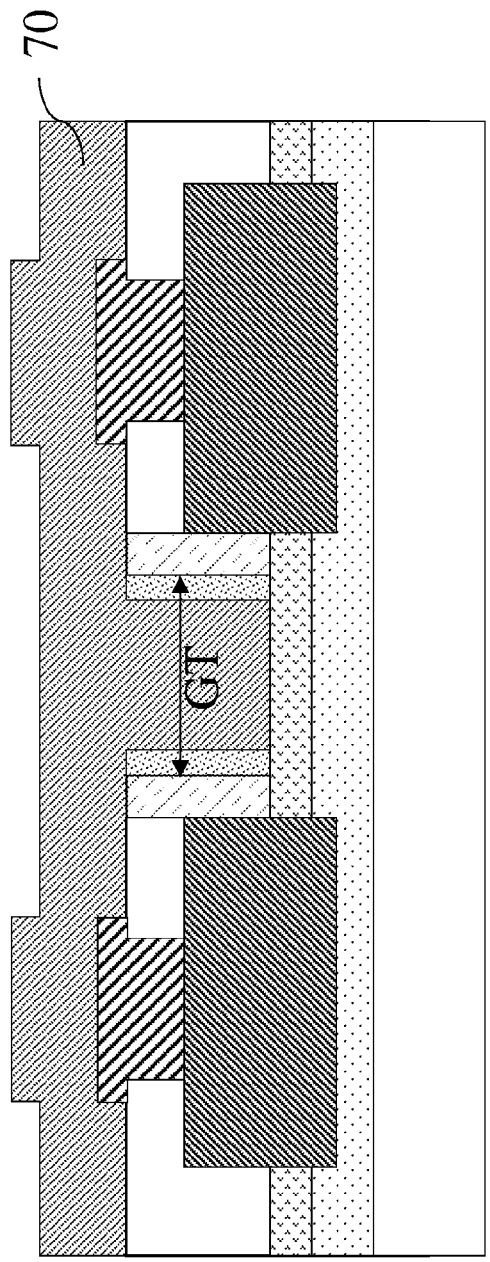

Referring to FIG. 2H, a gate electrode layer 70 is formed to cover the resulted structure of FIG. 2G. Thereafter, an etching process is performed on the gate electrode layer 70, so as to remove excess portions of the gate electrode layer 70, thereby forming the gate electrode 406A (i.e., the gate electrode 406A in FIG. 1) in the gate trench GT. A width of a bottom portion of the gate electrode 406A is less than a width of the gate trench GT. It should be noted that the dummy gate DG in the FIG. 2C is wider than the gate electrode 406. Thus, the semiconductor device 1A as shown in the FIG. 1 is obtained.

Figure 3:
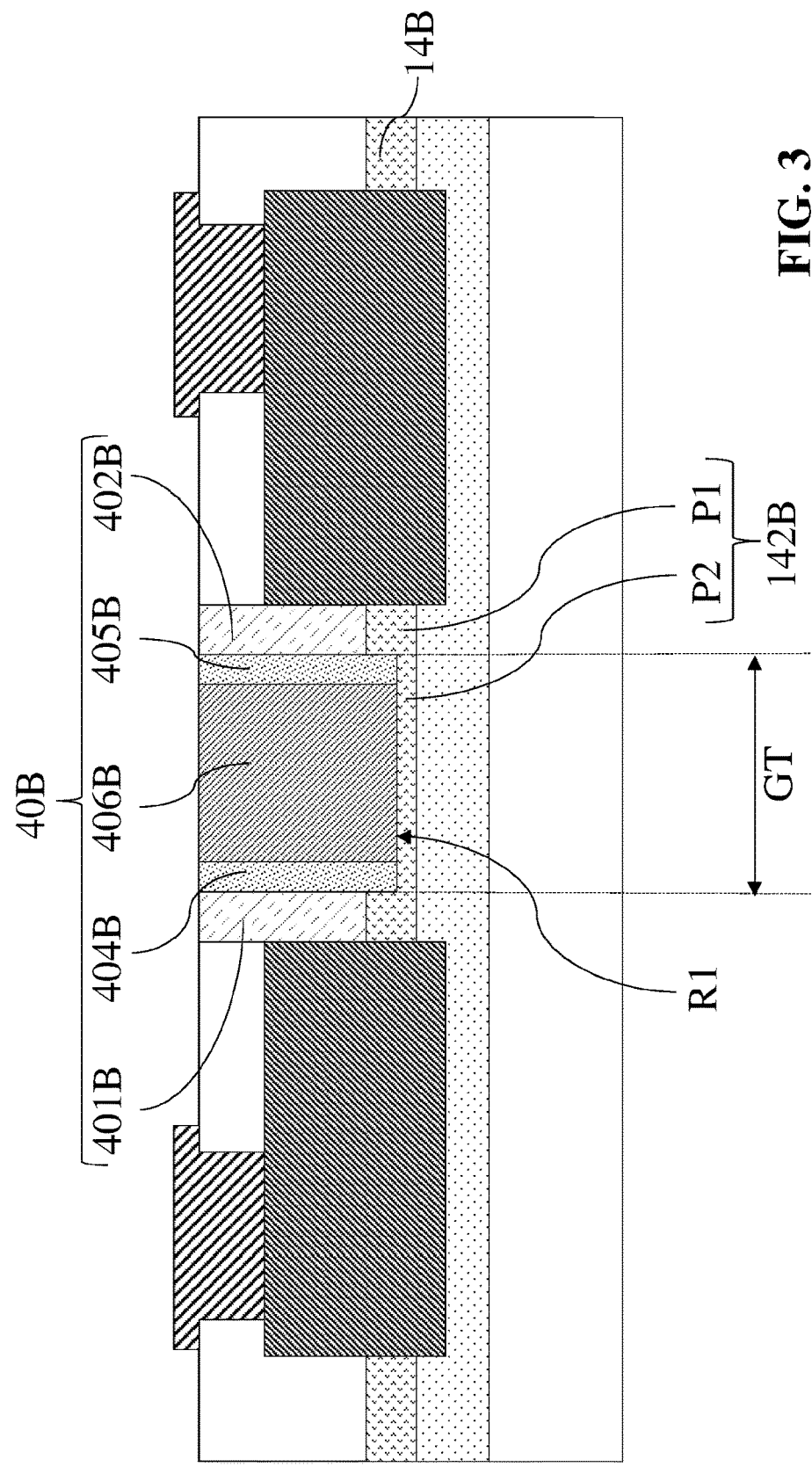
FIG. 3 is a vertical cross-sectional view of a semiconductor device according to some embodiments of the present disclosure.

FIG. 3 is a vertical cross-sectional view of a semiconductor device 1B according to some embodiments of the present disclosure. The semiconductor device 1B is similar to the semiconductor device 1A as described and illustrated with reference to FIG. 1, except that the gate structure 40A can be replaced by a gate structure 40B, and the nitride-based semiconductor layer 14A can be replaced by the nitride-based semiconductor layer 14B.

Referring to FIG. 3, with respect to the semiconductor device 1B, the portion 142B of the nitride-based semiconductor layer 14B can have a recess R1. The portions 142B can have parts P1, P2 with different thickness, in which the part P1 has a greater thickness than that of the part P2. The thinner part P2 is located between two thicker parts P1. Thus, a top surface of the part P2 and inner sidewalls of the two parts P1 collectively define a profile of the recess R1. A gate trench GT is collectively defined by inner sidewalls of portions 401B, 402B of the outer spacer and inner sidewalls of the portions 142B (i.e., inner sidewalls of the two thicker parts P2) of the nitride-based semiconductor layer 14B.

The portions 401B, 402B of the outer spacer can be disposed on/over/above the two thicker parts P1 of the portion 142B of the nitride-based semiconductor layer 14B, respectively. The portions 401B, 402B of the outer spacer can make contact with the two thicker parts P1 of the portion 142B of the nitride-based semiconductor layer 14B, respectively.

Each of the portions 404B, 405B of the inner spacer can be disposed on/over/above the thinner part P2 of the portion 142B of the nitride-based semiconductor layer 14B. Each of the portions 404B, 405B of the inner spacer extends downward to a position beneath an entirety of the outer spacer, such that a bottom end surface of the portion 404B/405B can make contact with the thinner part P2 of the portion 142B. The portion 404B/405B of the inner spacer has a downward extending length greater a thickness of the outer spacer, such that bottom end surfaces of the portions 404B, 405B of the inner spacer are lower than that of the portions 401B, 402B of the outer spacer. Bottom end surfaces of the portions 404B, 405B of the inner spacer are within a thickness of the nitride-based semiconductor layer 14B.

Similarly, the gate electrode 406B can be disposed on/over/above the thinner part P2 of the portion 142B of the nitride-based semiconductor layer 14B, such that a bottom end surface of the gate electrode 406B can make contact with the thinner part P2 of the portion 142B. The gate electrode 406B has a downward extending length greater a thickness of the outer spacer, such that a bottom end surface of the gate electrode 406B is lower than that of the portions 401B, 402B of the outer spacer. Bottom end surfaces of the portions 404B, 405B of the inner spacer are within a thickness of the nitride-based semiconductor layer 14B.

The bottom end surfaces of the portions 404B, 405B of the inner spacer and the bottom end surface of the gate electrode 406B are at the same height level. The portions 404B, 405B of the inner spacer and the gate electrode 406B extend downward to collaboratively form a bottom portion of the gate structure 40B. The recess R1 of the nitride-based semiconductor layer 14B can receive the bottom portion of the gate structure 40B.

During the manufacturing process of the semiconductor device 1B, the dummy gate DG and a portion of the blanket nitride-based semiconductor layer 62 are removed to collectively form a gate trench GT. Thereafter, portions 404B, 405B of the inner spacer and the gate electrode 406B are formed to collectively fill up the gate trench GT.

With the configuration of the present embodiment, the interface formed between the portions 404B, 405B of the inner spacer and the portion 142B of the nitride-based semiconductor layer 14B can misalign with the interface formed between the portions 401B, 402B of the outer spacer and the portion 142B of the nitride-based semiconductor layer 14B, so a path for at least one potential leakage current is further extended. The leakage current issue can be improved therefore.

Figure 4:
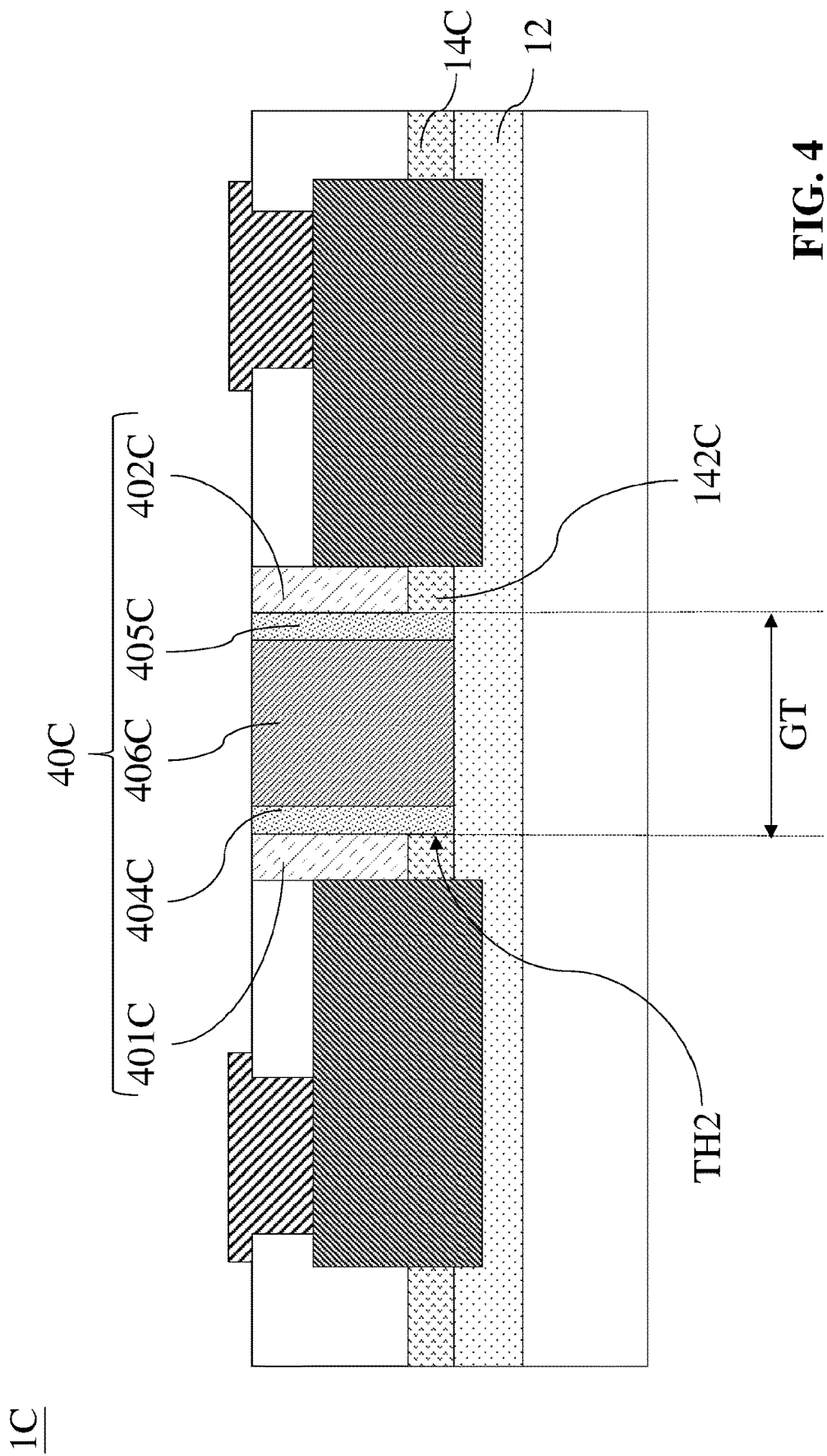
FIG. 4 is a vertical cross-sectional view of a semiconductor device according to some embodiments of the present disclosure.

FIG. 4 is a vertical cross-sectional view of a semiconductor device 1C according to some embodiments of the present disclosure. The semiconductor device 1C is similar to the semiconductor device 1A as described and illustrated with reference to FIG. 1, except that the gate structure 40A can be replaced by a gate structure 40C, and the nitride-based semiconductor layer 14A can be replaced by a nitride-based semiconductor layer 14C.

Referring to FIG. 4, with respect to the semiconductor device 1C, the portion 142C of the nitride-based semiconductor layer 14C can have a through hole TH2. A gate trench GT is collectively defined by inner sidewalls of portions 401C, 402C of the outer spacer and inner sidewalls of the portions 142C of the nitride-based semiconductor layer 14C.

Each of the portions 404C, 405C of the inner spacer extends downward to a position beneath an entirety of the outer spacer. The portion 404C/405C of the inner spacer has a downward extending length greater a thickness of the outer spacer.

Similarly, the gate electrode 406C extends downward to a position beneath an entirety of the outer spacer.

Bottom end surfaces of the portions 404C, 405C of the inner spacer and the bottom end surface of the gate electrode 406C are at the same height level. The portions 404C, 405C of the inner spacer and the gate electrode 406C extend downward to collaboratively form a bottom portion of the gate structure 40C. The portions 404C, 405C of the inner spacer and the gate electrode 406C can extend into the through hole TH2 to make contact with a top surface of the nitride-based semiconductor layer 12.

During the manufacturing process of the semiconductor device 1C, the dummy gate DG and a portion of the blanket nitride-based semiconductor layer 62 are removed to collectively form a gate trench GT. The gate trench GT exposes a top surface of the nitride-based semiconductor layer 12. Thereafter, portions 404C, 405C of the inner spacer and the gate electrode 406C are formed to collectively fill up the gate trench GT, and make contact with the top surface of the nitride-based semiconductor layer 12.

With the configuration of the present embodiment, the interface formed between the portions 404C, 405C of the inner spacer and the nitride-based semiconductor layer 12 can misalign with the interface formed between the portions 401C, 402C of the outer spacer and the nitride-based semiconductor layer 14C, so a path for at least one potential leakage current is further extended. The leakage current issue can be improved therefore.

Figure 5:
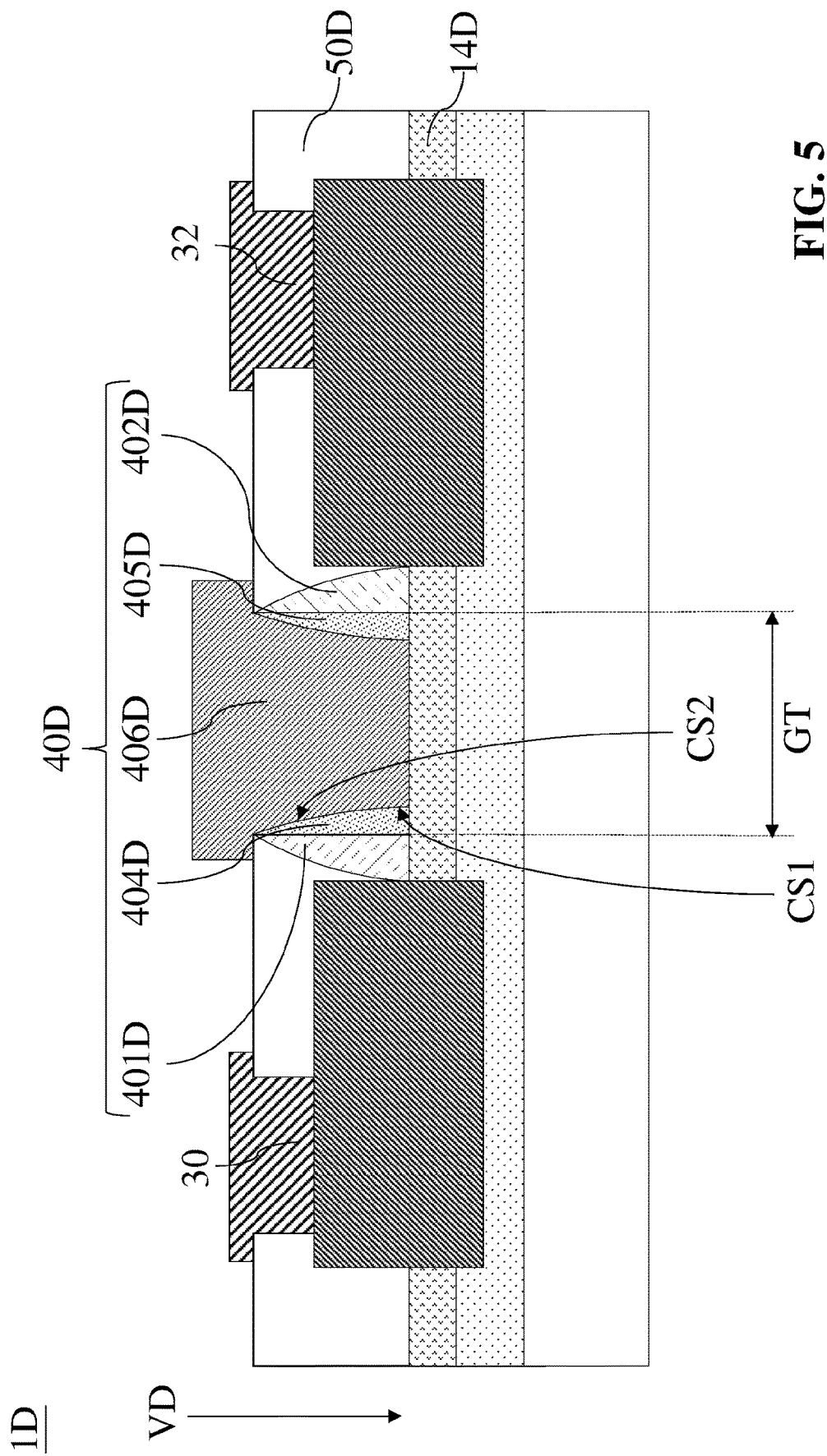
FIG. 5 is a vertical cross-sectional view of a semiconductor device according to some embodiments of the present disclosure.

FIG. 5 is a vertical cross-sectional view of a semiconductor device 1D according to some embodiments of the present disclosure. The semiconductor device 1D is similar to the semiconductor device 1A as described and illustrated with reference to FIG. 1, except that the gate structure 40A can be replaced by a gate structure 40D, and the passivation layer 50 can be replaced by a passivation layer 50D.

Referring to FIG. 5, with respect to the semiconductor device 1D, a width of each of the portions 404D and 405D of the inner spacer gradually increases along a vertical direction VD; and therefore, a width of the gate electrode 406D gradually decreases along the vertical direction VD for a reason that the gate trench GT is collectively filled up by the inner spacer and the gate electrode 406D.

Each of the portions 404D, 405D of the inner spacer has a curved surface CS1, in which the curved surface CS1 can be a convex surface toward the gate electrode 406D. The gate electrode 406D has a curved surface CS2, in which the shape of the curved surface CS2 is complementary to the shape of the curved surface CS1. The curved surface CS2 can be concaved. An interface formed between the portion 404D (or 405D) of the inner spacer and the gate electrode 406D is curved. Due to the aforesaid curved design, the stress in the gate structure 40D can be evenly distributed.

In addition, the portion 401D of the outer spacer has a curved surface facing toward the electrode 30. The portion 402D of the outer spacer has a curved surface facing toward the electrode 32. The curved surfaces of the portions 401D, 402D of the outer spacer can evenly distribute the stress from the passivation layer 50D.

During the manufacturing process of the semiconductor device 1D, the outer spacer and the inner spacer can be formed to have a curved surface by tuning at least one parameter, such as the selected etchant, temperature, or pressure.

Figure 6:
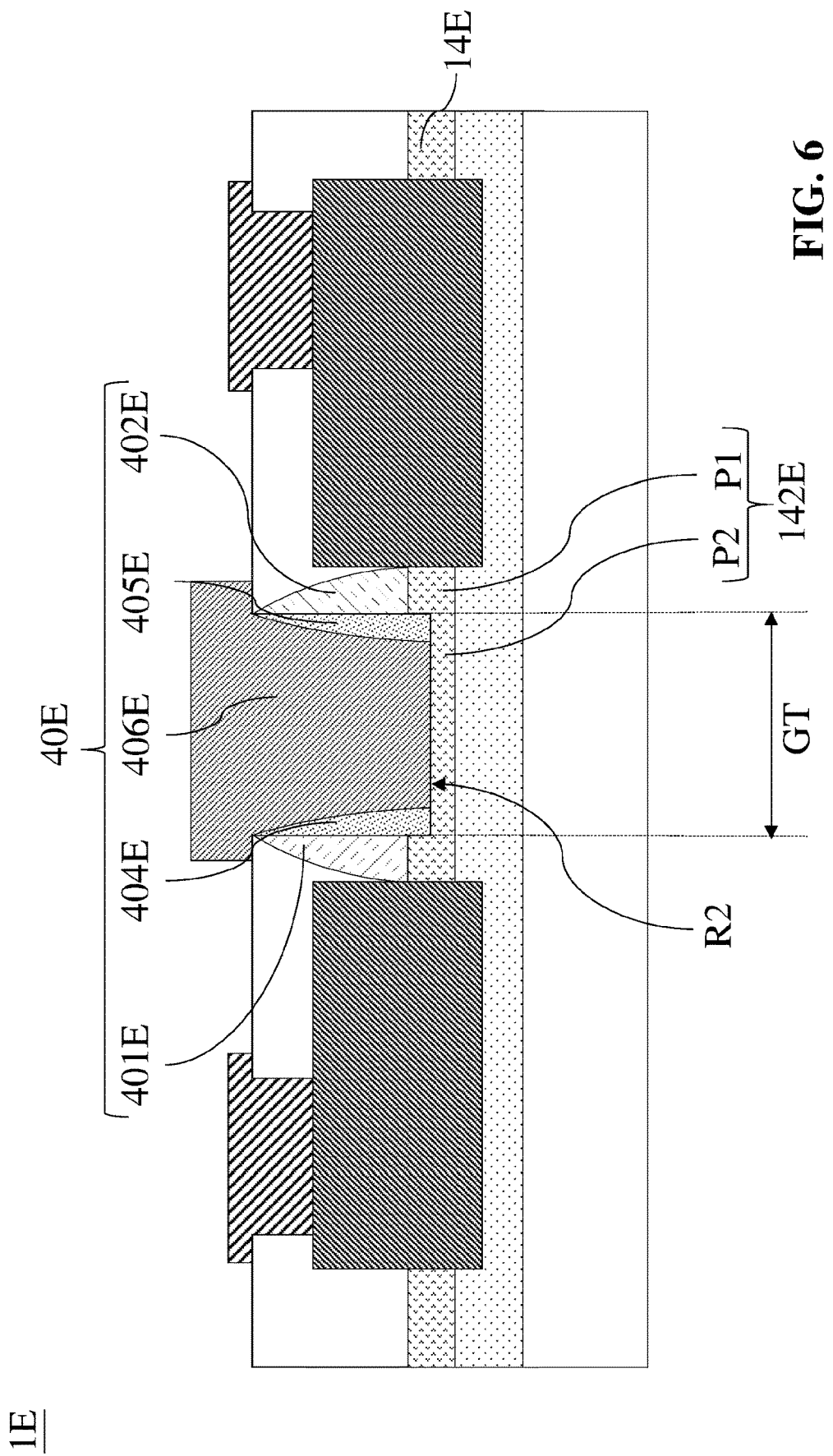
FIG. 6 is a vertical cross-sectional view of a semiconductor device according to some embodiments of the present disclosure.

FIG. 6 is a vertical cross-sectional view of a semiconductor device 1E according to some embodiments of the present disclosure. The semiconductor device 1E is similar to the semiconductor device 1D as described and illustrated with reference to FIG. 5, except that the gate structure 40D can be replaced by a gate structure 40E, and the nitride-based semiconductor layer 14D is replaced by a nitride-based semiconductor layer 14E.

Referring to FIG. 6, with respect to the semiconductor device 1E, the portion 142E of the nitride-based semiconductor layer 14E can have a recess R2. The portions 142B can have different parts P1, P2 with different thickness, in which the part P1 has a greater thickness than the part P2. The thinner part P2 is located between two thicker parts P1. Thus, a top surface of the part P2 and inner sidewalls of the two parts P1 collectively define a profile of the recess R2. A gate trench GT is collectively defined by inner sidewalls of portions 401E, 402E of the outer spacer and inner sidewalls of the portions 142E of the nitride-based semiconductor layer 14E.

Each of the portions 404E, 405E of the inner spacer can be disposed on/over/above the thinner part P2 of the portion 142E of the nitride-based semiconductor layer 14E. Each of the portions 404E, 405E of the inner spacer extends downward to a position beneath an entirety of the outer spacer, such that a bottom end surface of the portion 404E/405E can make contact with the thinner part P2 of the portion 142E. The portion 404E/405E of the inner spacer has a downward extending length greater a thickness of the outer spacer, such that bottom end surfaces of the portions 401E, 402E of the inner spacer are lower than that of the portions 401E, 402E of the outer spacer. Bottom end surfaces of the portions 404E, 405E of the inner spacer are within a thickness of the nitride-based semiconductor layer 14E.

Similarly, the gate electrode 406E can be disposed on/over/above the thinner part P2 of the portion 142E of the nitride-based semiconductor layer 14, such that a bottom end surface of the gate electrode 406E can make contact with the thinner part P2 of the portion 142E. The gate electrode 406E has a downward extending length greater a thickness of the outer spacer, such that a bottom end surface of the gate electrode 406E is lower than that of the portions 401E, 402E of the outer spacer. Bottom end surfaces of the portions 404E, 405E of the inner spacer are within a thickness of the nitride-based semiconductor layer 14E.

Bottom end surfaces of the portions 404E, 405E of the inner spacer and the bottom end surface of the gate electrode 406E are at the same height level. The portions 404E, 405E of the inner spacer and the gate electrode 406E extend downward to collaboratively form a bottom portion of the gate structure 40E. The recess R2 of the nitride-based semiconductor layer 14E can receive the bottom portion of the gate structure 40E.

During the manufacturing process of the semiconductor device 1E, the dummy gate DG and a portion of the blanket nitride-based semiconductor layer 62 are removed to collectively form a gate trench GT. Thereafter, portions 404E, 405E of the inner spacer and the gate electrode 406E are formed to collectively fill up the gate trench GT.

Figure 7:
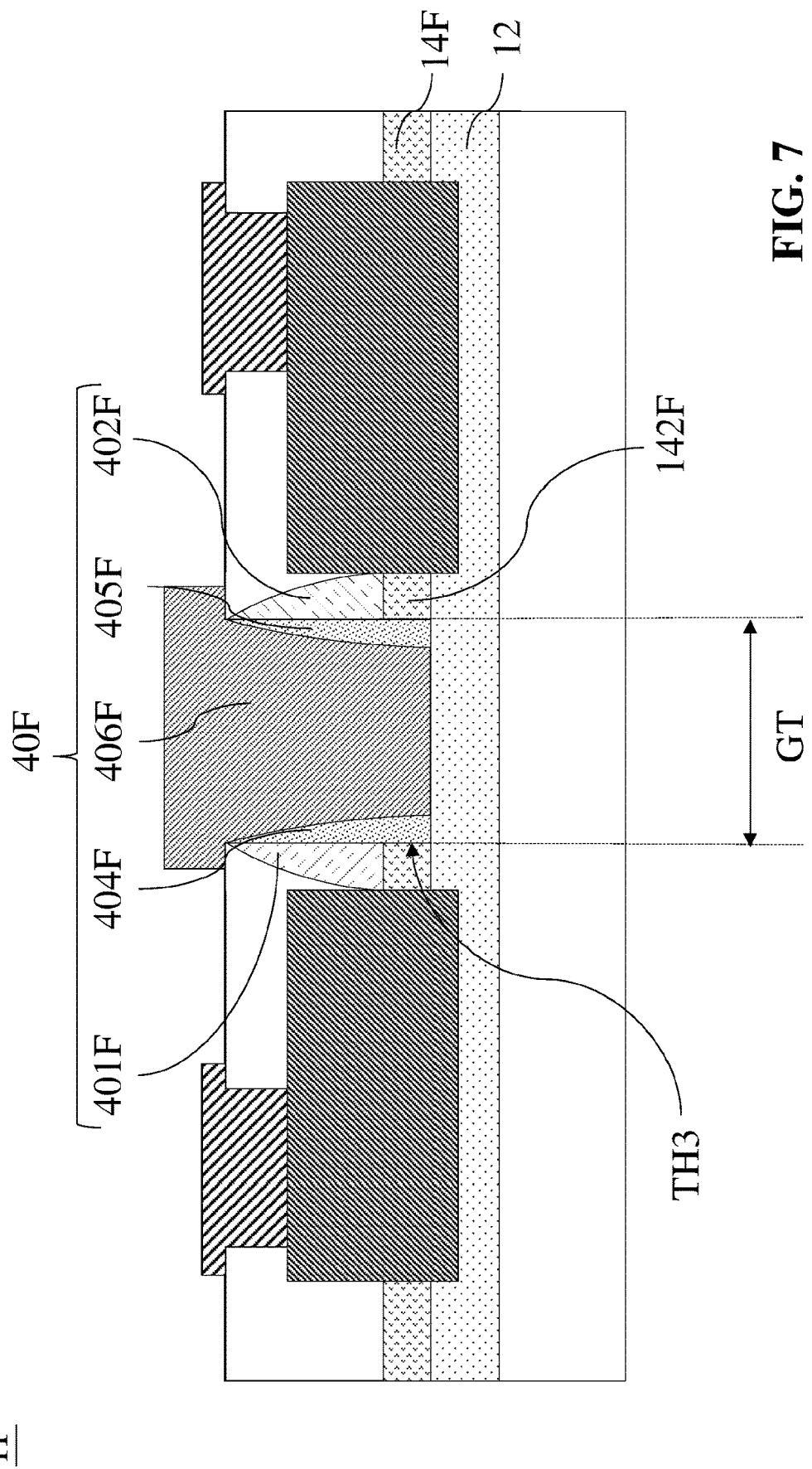
FIG. 7 is a vertical cross-sectional view of a semiconductor device according to some embodiments of the present disclosure.

FIG. 7 is a vertical cross-sectional view of a semiconductor device 1F according to some embodiments of the present disclosure. The semiconductor device 1F is similar to the semiconductor device 1D as described and illustrated with reference to FIG. 5, except that the nitride-based semiconductor layer 14D is replaced by a nitride-based semiconductor layer 14F, and the gate structure 40D can be replaced by a gate structure 40F.

Referring to FIG. 7, with respect to the semiconductor device 1F, the portion 142F of the nitride-based semiconductor layer 14F can have a through hole TH3. A gate trench GT is collectively defined by inner sidewalls of portions 401F, 402F of the outer spacer and inner sidewalls of the portion 142F of the nitride-based semiconductor layer 14F.

Each of the portions 404F, 405F of the inner spacer extends downward to a position beneath an entirety of the outer spacer. Each of the portions 404F, 405F of the inner spacer has a downward extending length greater a thickness of the outer spacer.

Similarly, the gate electrode 406F extends downward to a position beneath an entirety of the portions 401F, 402F of the outer spacer.

Bottom end surfaces of the portions 404F, 405F of the inner spacer and the bottom end surface of the gate electrode 406F are at the same height level. The portions 404F, 405F of the inner spacer and the gate electrode 406F extend downward to collaboratively form a bottom portion of the gate structure 40F. The portions 404F, 405F of the inner spacer and the gate electrode 406F can extend into the through hole TH3 to make contact with a top surface of the nitride-based semiconductor layer 12.

During the manufacturing process of the semiconductor device 1F, the dummy gate DG and a portion of the blanket nitride-based semiconductor layer 62 are removed to collectively form a gate trench GT. The gate trench GT exposes a top surface of the nitride-based semiconductor layer 12. Thereafter, portions 404F, 405F of the inner spacer and the gate electrode 406C are formed to collectively fill up the gate trench GT, so as to make contact with the top surface of the nitride-based semiconductor layer 12.

Figure 8:
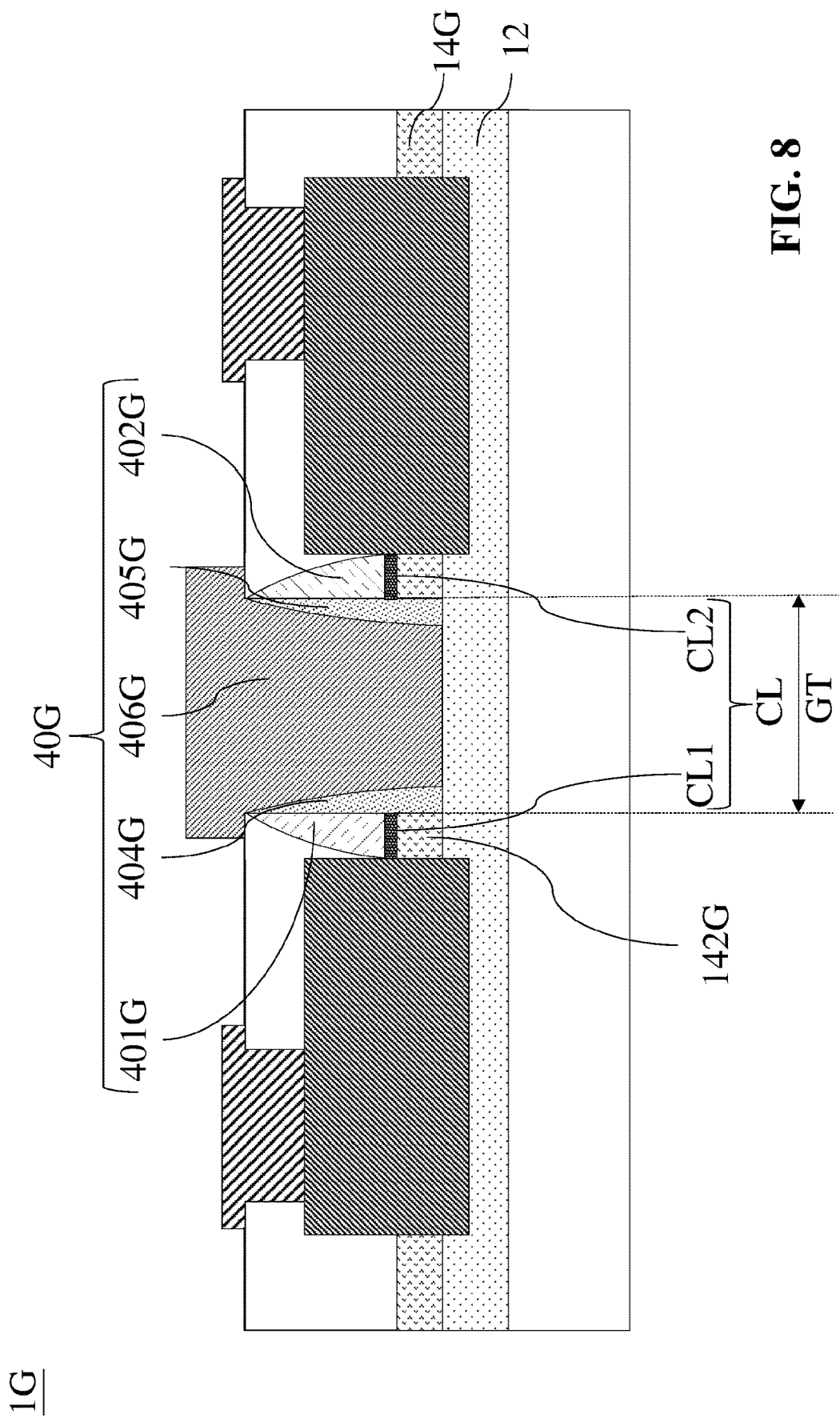
FIG. 8 is a vertical cross-sectional view of a semiconductor device according to some embodiments of the present disclosure.

FIG. 8 is a vertical cross-sectional view of a semiconductor device 1G according to some embodiments of the present disclosure. The semiconductor device 1G is similar to the semiconductor device 1F as described and illustrated with reference to FIG. 7, except that the gate structure 40F can be replaced by a gate structure 40G, and the semiconductor device 1G further includes a capping layer CL. The capping layer CL includes two separated portions CL1, CL2.

Referring to FIG. 8, with respect to the semiconductor device 1G, the portion CL1 of the capping layer CL is disposed between the portion 401G of the outer spacer and the portion 142G of the nitride-based semiconductor layer 14G. The portion CL2 of the capping layer CL is disposed between the portion 402G of the outer spacer and the portion 142G of the nitride-based semiconductor layer 14G. Widths of the portion CL1, CL2 of the capping layer CL are substantially the same as widths of bottom end surfaces of the portions 401G, 402G of the outer spacer, respectively. The portions CL1, CL2 of the capping layer CL abuts against with the portions 404G, 405G of the inner spacer, respectively.

A gate trench GT is collectively defined by inner sidewalls of portions 401G, 402G of the outer spacer, the portions CL1, CL2 of the capping layer CL, and inner sidewalls of the portions 142G of the nitride-based semiconductor layer 14G. The portion 404G of the inner spacer makes contact with the inner sidewalls of the portion 401G of the outer spacer, the portion CL1 of the capping layer CL, and the portion 142G of the nitride-based semiconductor layer 14G. The portion 405G of the inner spacer makes contact with the inner sidewalls of the portion 402G of the outer spacer, the portion CL2 of the capping layer CL, and the portion 142G of the nitride-based semiconductor layer 14G.

The exemplary materials of the capping layer CL can be, dielectric materials. For example, the dielectric materials can include, for example but are not limited to, $SiN_x$, $SiO_x$, $Si_3N_4$, SiON, SiC, SiBN, SiCBN, oxides, nitrides, plasma enhanced oxide (PEOX), or combinations thereof.

During the manufacturing process of the semiconductor device 1G, the blanket capping layer (not shown) is formed between the blanket nitride-based semiconductor layer 62 and the blanket dielectric layer 64. Then, a portion of the blanket capping layer and the dummy gate are removed, such that two separated portions of the blanket capping layer (i.e., the portions CL1, CL2 of the capping layer CL) are remained under the two separated portions 401G and 402G of the outer spacer.

In embodiments that involve the inner spacer having the curved surfaces, the formation of the gate electrode can have the yield rate improved since the curved profile can facilitate the filling of the gate electrode layer to be patterned into the gate electrode.

In the exemplary manufacturing stages as above embodiments, a dummy gate is used for defining a gate trench. Before formation of a gate electrode, the dummy gate is removed by using an etching process. However, due to the character of the etching process, the barrier layer (or channel layer) beneath the dummy gate may be over-etched such that the electrical properties of the semiconductor device would be worsen. Moreover, after the etching process, the top surface of a layer (e.g., a barrier layer) beneath the dummy gate would be rugged due to a high etching rate, resulting in poor electrical contact between the gate electrode and the barrier layer.

At least to avoid the aforesaid issue, the present disclosure is to develop a novel structure for the semiconductor device.

Figure 9:
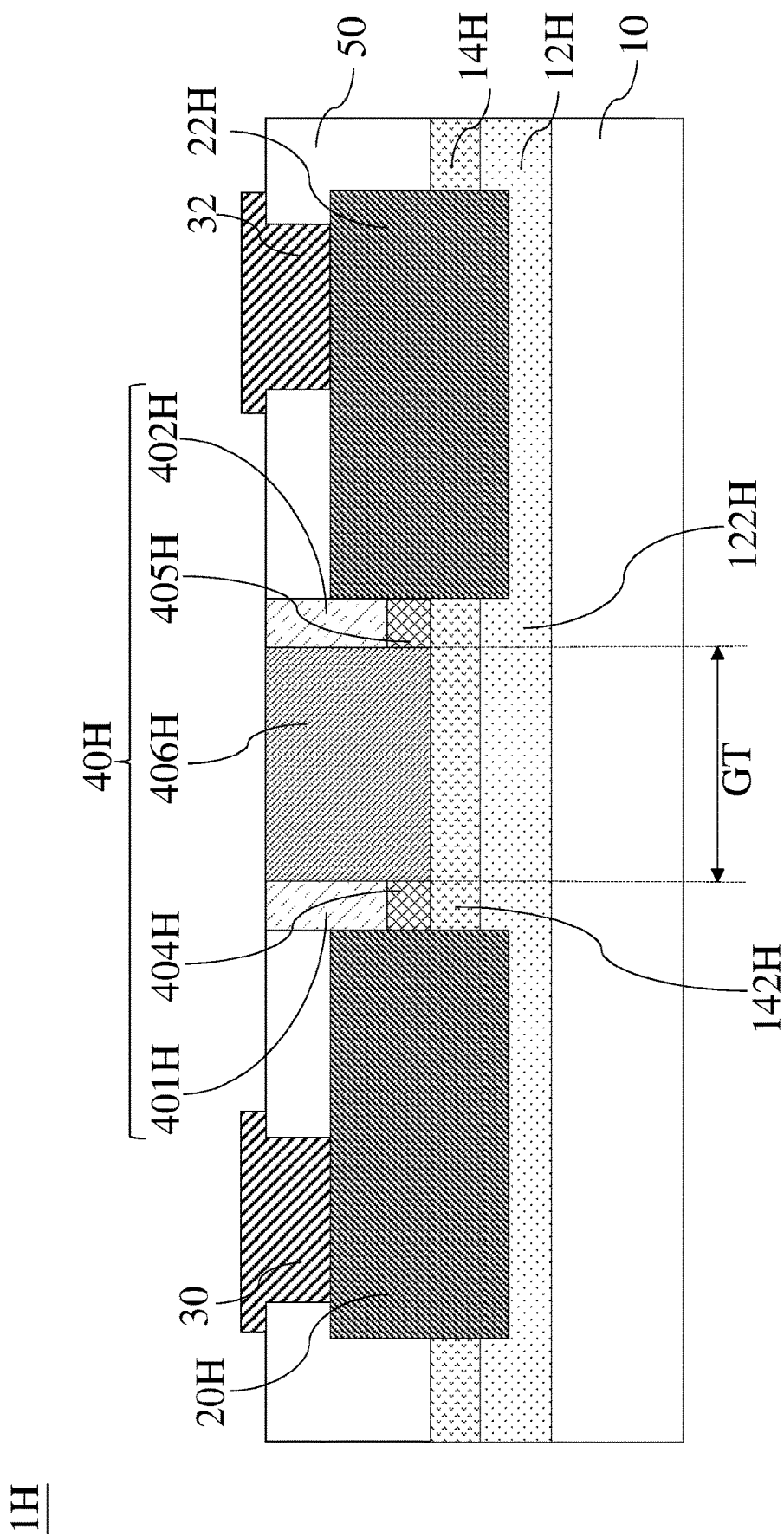
FIG. 9 is a vertical cross-sectional view of a semiconductor device according to some embodiments of the present disclosure.

FIG. 9 is a vertical cross-sectional view of a semiconductor device 1H according to some embodiments of the present disclosure. The semiconductor device 1H includes a substrate 10, nitride-based semiconductor layers 12H and 14H, doped nitride-based semiconductor layers 20H, 22H, electrodes 30, 32, a gate structure 40H and a passivation layer 50. The descriptions for the identical or similar layers as afore-mentioned are omitted.

The gate structure 40H is disposed on/over/above the portion 142H of the nitride-based semiconductor layer 14H and the portion 122H of the nitride-based semiconductor layer 12H. The gate structure 40H is disposed between the electrodes 30 and 32. The gate structure 40H is confined between the electrodes 30 and 32 (or the doped nitride-based semiconductor layers 20, 22). The gate structure 40H includes a gate spacer layer including two separated portions 401H and 402H, an etching stop layer including two separated portions 404H and 405H, and a gate electrode 406H. The detailed mechanism will be fully described as follows.

In the present disclosure, before forming the gate structure 40H, a plurality of dielectric material layers can be formed as a stacked structure on/over/above the nitride-based semiconductor layer 14H, in which the dielectric material layers including at least one blanket etching stop layer. The chemical/physical property of the blanket etching stop layer is different from the other dielectric material layers. In some embodiments, the chemistry of the blanket etching stop layer is selected to have a slow etching rate with respect to an etchant than those of the other dielectric material layers with respect to the same etchant. In some embodiments, the physical property of the blanket etching stop layer is selected to have a slow etching rate with respect to a dry etcher (e.g., a plasma etcher) than those of the other dielectric material layers with respect to the same dry etcher.

Then, during the formation of the gate trench GT, an etching process is performed on the stacked structure, and then the etching process would be stopped or retarded at the blanket etching stop layer of the stacked structure due to its chemistry/physical properties. After that, another etching process is performed on the etched stacked structure again to etch through the etched blanket etching stop layer, such that a gate trench GT with a predetermined depth is achieved. Thus, portions of the blanket etching stop layer (i.e., the portions 404H, 405H of the etching stop layer) are remained on/over/above the nitride-based semiconductor layer 14H.

Based on the above, due to the existence of the blanket etching stop layer, the first etching process would be stopped/retarded at a position higher than a top surface of a portion 142H of the nitride-based semiconductor layer 14H. After that, a second etching process is performed to etch through the remained blanket etching stop layer to form the gate trench GT. The blanket etching stop layer can protect the top surface of the nitride-based semiconductor layer 14H; and thus, the uniformity of the top surface of the nitride-based semiconductor layer 14H (i.e., the barrier layer) can be improved. Furthermore, leakage of currents due to the surface trap of the nitride-based semiconductor layer 14H can be avoided, thereby decreasing an on-resistance of the semiconductor device 1H.

Moreover, the blanket etching stop layer provides a better control of the etch thickness, such that the formed gate trench GT can achieve to a desired/predetermined depth. Fluctuations in on-resistance and fluctuations in threshold voltage of the semiconductor device due to the inaccurate etch thickness can be avoided. The reliability and performance of the semiconductor device 1H can be improved.

The detail configuration of the gate structure 40H will be fully described as follows.

The portions 401H, 402H of the gate spacer layer are disposed on/over/above the portion 142H of the nitride-based semiconductor layer 14H and the portion 122H of the nitride-based semiconductor layer 12H. Each of the portions 401H, 402H of the gate spacer layer has a width that is substantially constant. The exemplary materials of the gate spacer layer can be, for example, $Si_3O_4$.

The portions 404H, 405H of the etching stop layer (i.e., the remained portions of the blanket etching stop layer) are disposed on/over/above the portion 142H of the nitride-based semiconductor layer 14H. The portions 404H, 405H of the etching stop layer are in contact with the portion 142H of the nitride-based semiconductor layer 14H. Each of the portions 404H, 405H of the etching stop layer is disposed between the gate spacer layer and the nitride-based semiconductor layer 14H. The separated portions 404H and 405H of the etching stop layer are disposed beneath two separated portions 401H, 402H of the gate spacer layer, respectively. Each of the portions 404H, 405H of the etching stop layer has a width that is substantially constant. A width of the portion 404H of the etching stop layer is substantially the same as a width of the portion 401H of the gate spacer layer. A width of the portion 405H of the etching stop layer is substantially the same as a width of the portion 402H of the gate spacer layer.

The exemplary materials of the etching stop layer can be, for example, aluminum nitride (AlN), aluminum oxide ($Al_2O_3$), silicon nitride (SiN), or combinations thereof.

The portions 404H, 405H of the etching stop layer defines a gate trench GT with the portions 401H, 402H of the gate spacer layer collectively. To be more specific, the gate trench GT has a boundary defined by inner sidewalls of the portions 401H and 402H of the gate spacer layer and the portions 404H and 405H of the etching stop layer.

The gate electrode 406H is disposed in the gate trench GT. The gate electrode 406H extends downward into the gate trench GT, such that the gate electrode 406H can make contact with the nitride-based semiconductor layer 14H. A bottom surface of the gate electrode 406H and a bottom surface of the portions 404H and 405H of the etching stop layer are at the same height level.

The doped nitride-based semiconductor layers 20H and 22H are located at two opposite sides of the gate structure 40H, respectively. Each of the doped nitride-based semiconductor layers 20H and 22H can penetrate the nitride-based semiconductor layer 14H and extend into the nitride-based semiconductor layer 12H, such that portions 122H, 142H of nitride-based semiconductor layers 12H and 14H are sandwiched/located between the doped nitride-based semiconductor layers 20H and 22H. The doped nitride-based semiconductor layer 20H is disposed between the electrode 30 and the nitride-based semiconductor layer 12H. The doped nitride-based semiconductor layer 22H is disposed between the electrode 32 and the nitride-based semiconductor layer 12H.

The doped nitride-based semiconductor layers 20H extends horizontally/laterally to an outer sidewall of the portion 401H of the gate spacer layer, an outer sidewall of the portion 404H of the etching stop layer, an outer sidewall of the portion 142H of the nitride-based semiconductor layer 14H, and an outer sidewall of the portion 122H of the nitride-based semiconductor layer 12H. The doped nitride-based semiconductor layer 20H abuts against the portion 401H of the gate spacer layer, and the portion 404H of the etching stop layer, the portion 142H of the nitride-based semiconductor layer 14H, and the portion 122H of the nitride-based semiconductor layer 12H.

The doped nitride-based semiconductor layers 22H extends horizontally/laterally to an outer sidewall of the portion 402H of the gate spacer layer, an outer sidewall of the portion 405H of the etching stop layer, an outer sidewall of the portion 142H of the nitride-based semiconductor layer 14H, and an outer sidewall of the portion 122H of the nitride-based semiconductor layer 12H. The doped nitride-based semiconductor layer 22H abuts against the portion 402H of the gate spacer layer, and the portion 405H of the etching stop layer, the portion 142H of the nitride-based semiconductor layer 14H, and the portion 122H of the nitride-based semiconductor layer 12H.

The gate electrode 406H is separated apart from the doped nitride-based semiconductor layers 20H,22H by the gate spacer layer and the etching stop layer. The gate spacer layer and the etching stop layer can collectively provide a good insulation between the doped nitride-based semiconductor layer 20H/22H and the gate electrode 406H, such that gate leakage can be significantly reduced.

Different stages of a method for manufacturing the semiconductor device 1H are shown in FIG. 10A, FIG. 10B, FIG. 10C, FIG. 10D, FIG. 10E, FIG. 10F, and FIG. 10G, as described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figure 10A:
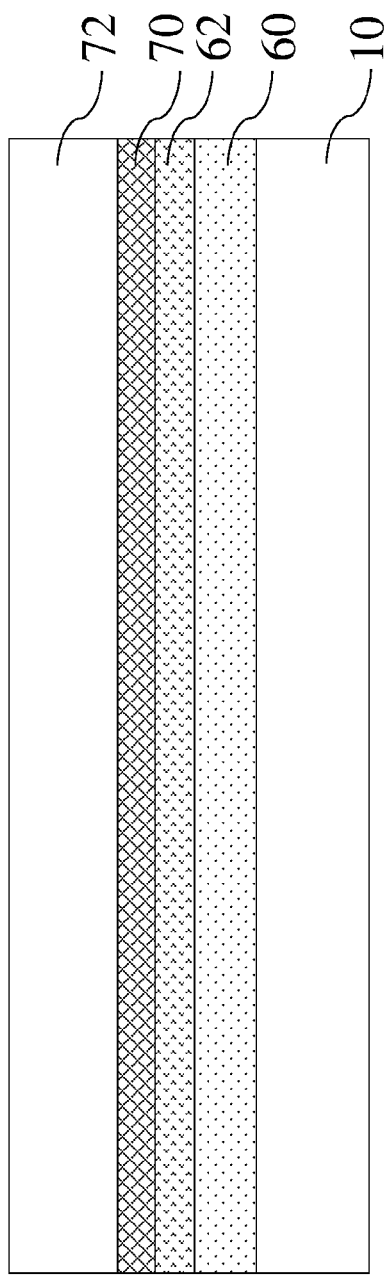
FIG. 10A, FIG. 10B, FIG. 10C, FIG. 10D, FIG. 10E, FIG. 10F, and FIG. 10G show different stages of a method for manufacturing a semiconductor device according to some embodiments of the present disclosure.

Referring to FIG. 10A, a substrate 10 is provided. Blanket nitride-based semiconductor layers 60 and 62 can be formed on/over/above the substrate 10 in sequence by using deposition techniques. A blanket etching stop layer 70 can be formed on/over/above the blanket nitride-based semiconductor layer 62. A dielectric layer 72 can be formed on/over/above the blanket etching stop layer 70. The formation of the blanket nitride-based semiconductor layers 60 and 62, the blanket etching stop layer 70 and the dielectric layer 72 can include deposition techniques. In some embodiments, the deposition techniques can be performed for forming a blanket layer. In some embodiments, the exemplary materials of the dielectric layer 72 can include, for example, $SiO_2$, and the exemplary materials of the blanket etching stop layer 70 can include, for example, aluminum nitride (AlN), aluminum oxide ($Al_2O_3$), silicon nitride (SiN), or combinations thereof.

Figure 10B:
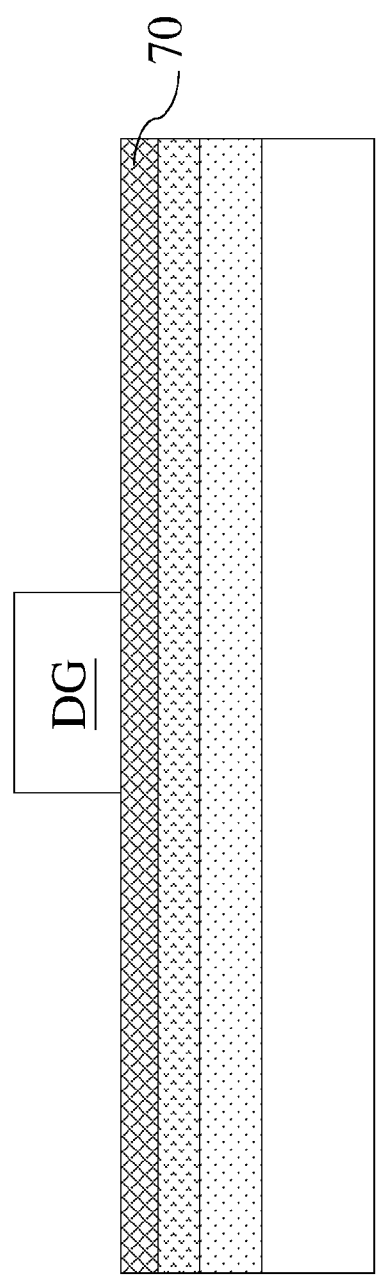

Referring to FIG. 10B, a patterning process can be performed on the dielectric layer 70, such that excess portions thereof can be removed, thereby remaining at least a portion of the dielectric layer 72 on the blanket etching stop layer 70. The remained portion of the dielectric layer 72 can serve as a dummy gate DG.

Figure 10C:
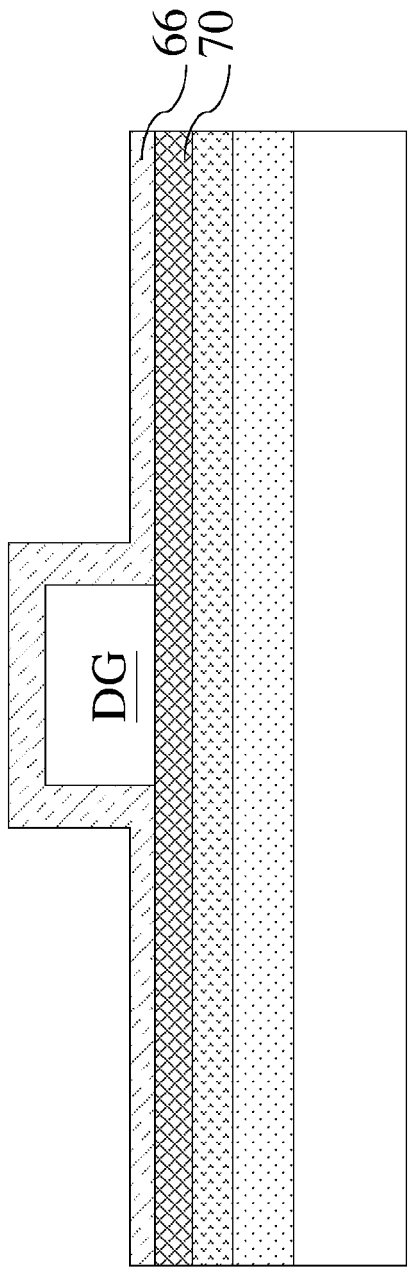

Referring to FIG. 10C, a blanket spacer layer 66 is formed to cover the dummy gate DG and a top surface of the blanket etching stop layer 70. In some embodiments, the exemplary materials of the blanket spacer layer 66 can include, for example, $Si_3O_4$.

Figure 10D:
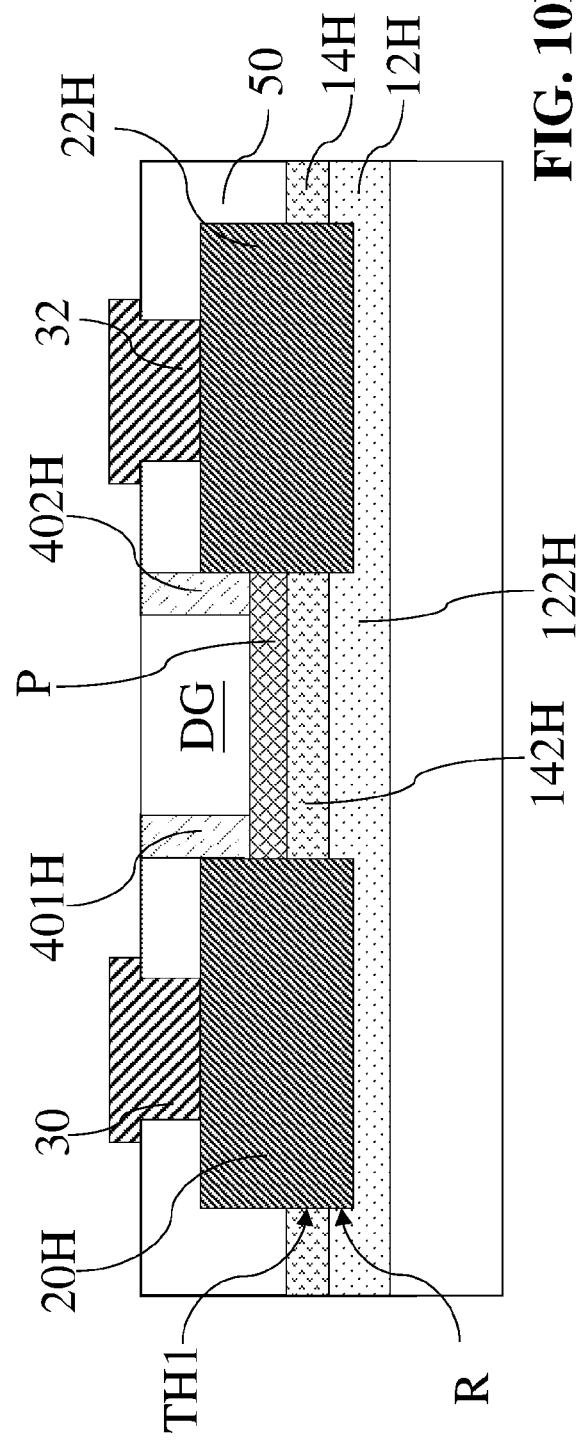

Referring to FIG. 10D, a portion of the blanket spacer layer 66 is removed to expose a portion of the blanket nitride-based semiconductor layer 62. Then, the blanket nitride-based semiconductor layers 60 and 62 are patterned, such that a nitride-based semiconductor layer 14H with two through holes TH1 and a nitride-based semiconductor layer 12H with two recesses R can be formed. The two recesses R are aligned with the two through holes TH1, respectively.

After that, the doped nitride-based semiconductor layers 20H and 22H are formed in the through holes TH1 and the recesses R, respectively. Each of the doped nitride-based semiconductor layers 20H and 22H can penetrate the nitride-based semiconductor layer 14H and extend into the nitride-based semiconductor layer 12H. The portion 142H of the nitride-based semiconductor layer 14H and the portion 122H of the nitride-based semiconductor layer 12H can be well defined/confined between the doped nitride-based semiconductor layers 20H and 22H.

Next, another portion of the blanket spacer layer 66 is removed to expose a top surface of the dummy gate DG, and some remained portions of the blanket spacer layer 66 are remained at two opposite outer sidewalls of the dummy gate DG to serve as the portions 401H and 402H of the gate spacer layer. A blanket passivation layer is formed to cover the nitride-based semiconductor layer 14H, the doped nitride-based semiconductor layers 20H and 22H, the portions 401H and 402H, and the dummy gate DG. In some embodiments, excess portions of the blanket passivation layer are removed, thereby exposing top surfaces of the portions 401H and 402H, and the dummy gate DG.

After that, an etching process is performed on the blanket passivation layer to form a plurality of through holes to expose top surfaces of the doped nitride-based semiconductor layers 20H and 22H. Thus, a passivation layer 50 is formed. The passivation layer 50 is formed to cover the nitride-based semiconductor layer 14H and the doped nitride-based semiconductor layers 20H and 22H. Then, the blanket electrode layer is formed to cover the resulted structure, such that portions of the blanket electrode layer fills up the through holes of the passivation layer 50. The blanket electrode layer is formed to make contact with the doped nitride-based semiconductor layers 20H and 22H through the through holes of the the passivation layer 50. An etching process is performed on the blanket electrode layer to remove the excess portions thereof, thereby forming electrodes 30, 32 with T-shaped profile. The electrodes 30 and 32 are formed on/over/above the doped nitride-based semiconductor layers 20H and 22H, respectively.

Figure 10E:
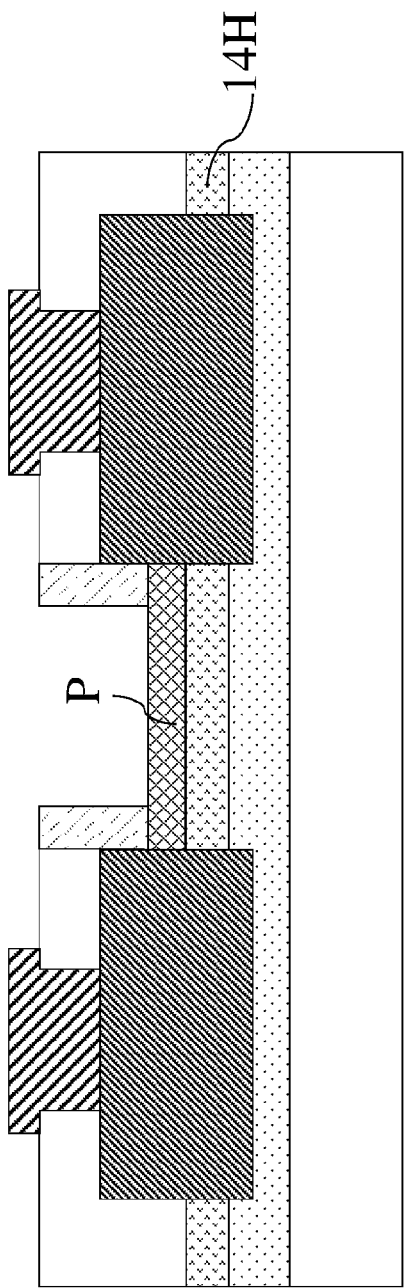

Referring to FIG. 10E, a first etching process is performed on the dummy gate DG. After the first etching process, the dummy gate DG is removed, such that the portion P of the blanket etching stop layer 70 is exposed.

In some embodiments, the first etching process can be performed by using a wet etching process. An etchant is applied to the wet etching process. Etching selectivity between the blanket etching stop layer 70 and the dummy gate DG can be achieved by a desired etchant. For example, an etching rate of the blanket etching stop layer 70 with respect to the etchant is much less than an etching rate of the dummy gate DG with respect to the same etchant during the wet etching process.

In some embodiments, the first etching process can be performed by using a dry etching process. A dry etcher (e.g., plasma etcher) can be applied to the dry etching process. In some embodiments, etching selectivity between the blanket etching stop layer 70 and the dummy gate DG can be achieved by a material selection. For example, the materials of the blanket etching stop layer 70 and the dummy gate DG are well selected such that the compactness of the blanket etching stop layer is much greater than that of the dummy gate DG.

Hence, an etching rate of the blanket etching stop layer 70 with respect to the dry etcher is much less than an etching rate of the dummy gate DG with respect to the same dry etcher during the dry etching process.

Therefore, in response to the etching selectivity, the first etching process can be stopped/retarded at the blanket etching stop layer 70 (i.e., a position higher than the nitride-based semiconductor layer 14H).

Figure 10F:
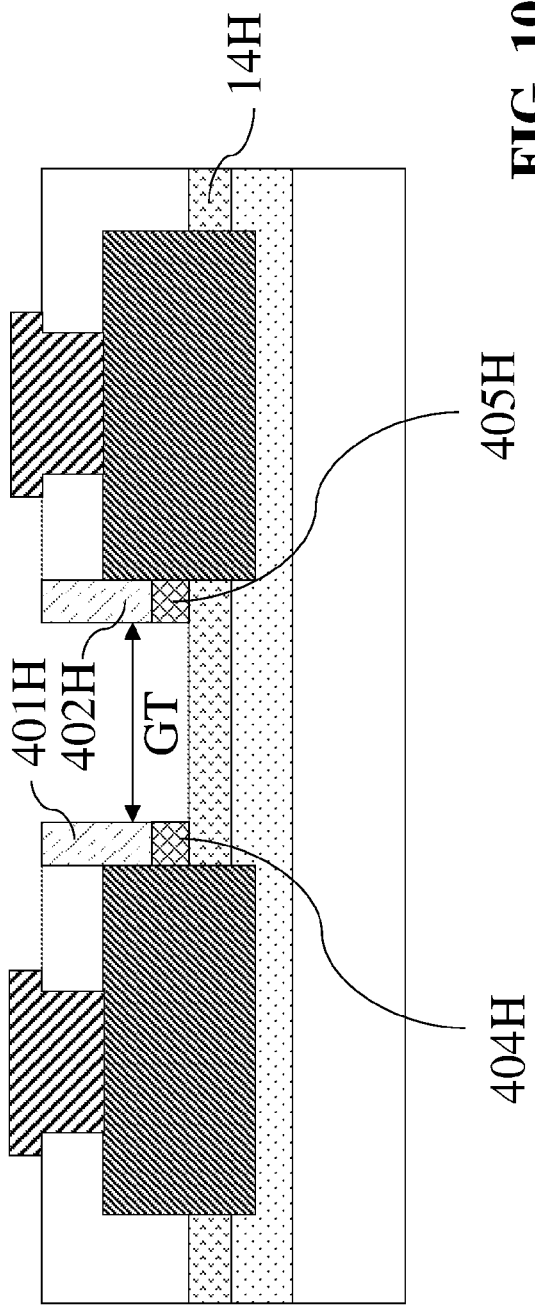

Referring to FIG. 10F, a second etching process is performed on the portion P of the blanket etching stop layer 70 to remove at least one part of the portion P of the blanket etching stop layer 70, such that a gate trench GT exposing a top surface of the nitride-based semiconductor layer 14H is formed. After the second etching process, the portions 404H, 405H of the etching stop layer are formed. The portions 404H, 405H of the etching stop layer can be formed to have the same width as the portion 401H, 402H of the gate spacer layer, respectively.

In some embodiments, the first etching process can include a dry etching process or a wet etching process, and the second etching process can include a dry etching process or a wet etching process. The selection of the dry or a wet etching process can modify the morphology of the inner sidewalls of the portions 404H, 405H of the etching stop layer and the inner sidewalls of the portions 401H, 402H of the gate spacer layer.

In some embodiments, the first etching process can be a dry etching process and the second etching process can be a dry etching process. Therefore, the inner sidewalls of the portions 404H, 405H of the etching stop layer and the portions 401H, 402H of the gate spacer layer can be flat.

In some embodiments, the first etching process can be a wet etching process and the second etching process can be a dry etching process. Therefore, the inner sidewalls of the portions 401H, 402H of the gate spacer layer can be inwardly recessed, and the inner sidewalls of the portions 404H, 405H of the etching stop layer 407 can be flat.

In some embodiments, the first etching process can be a dry etching process and the second etching process can be a wet etching process. Therefore, the inner sidewall of the portions 401H, 402H of the gate spacer layer can be flat, and the inner sidewall of the portions 404H, 405H of the etching stop layer can be inwardly recessed.

In some embodiments, the first etching process can be a wet etching process and the second etching process can be a wet etching process. Therefore, the inner sidewalls of the portions 404H, 405H of the etching stop layer and the portions 401H, 402H of the gate spacer layer can be inwardly recessed.

The morphology of the inner sidewalls of the etching stop layer and the gate spacer layer can be determined by a combination of dry and wet etching processes, thereby further achieving different electrical properties and having more design flexibility.

Figure 10G:
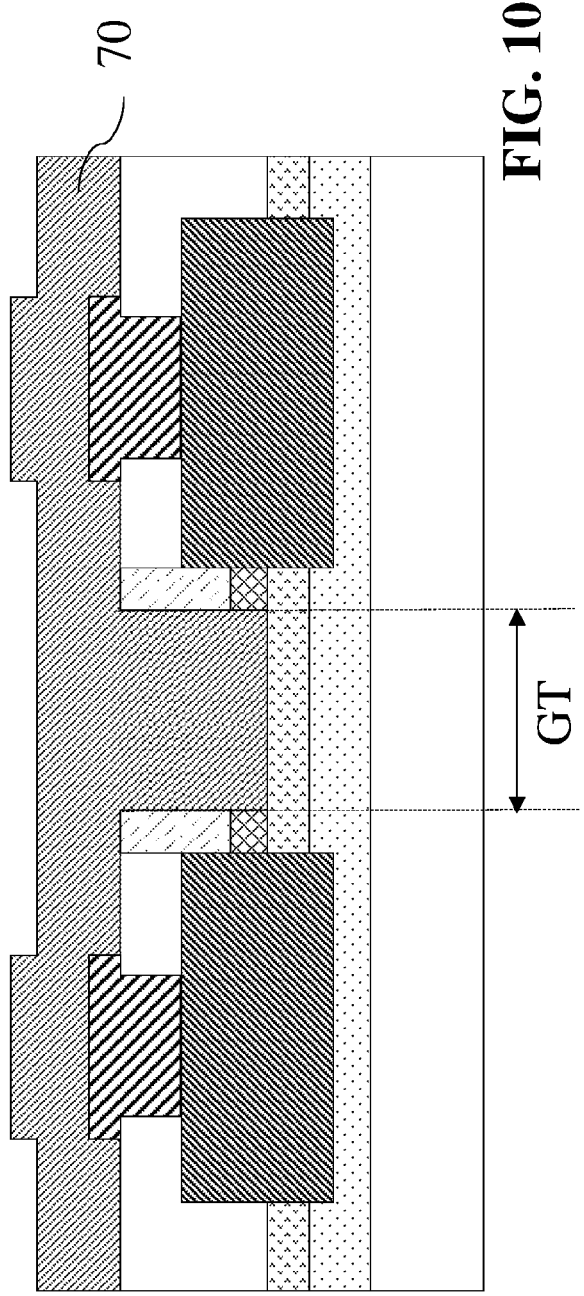

Referring to FIG. 10G, a gate electrode layer 70 is formed to cover the resulted structure of FIG. 10H. Thereafter, an etching process is performed on the gate electrode layer 70, so as to remove excess portions of the gate electrode layer 70, thereby forming the gate electrode 406H in the gate trench GT. Thus, the semiconductor device 1H as shown in the FIG. 9 is obtained.

Figure 11A:
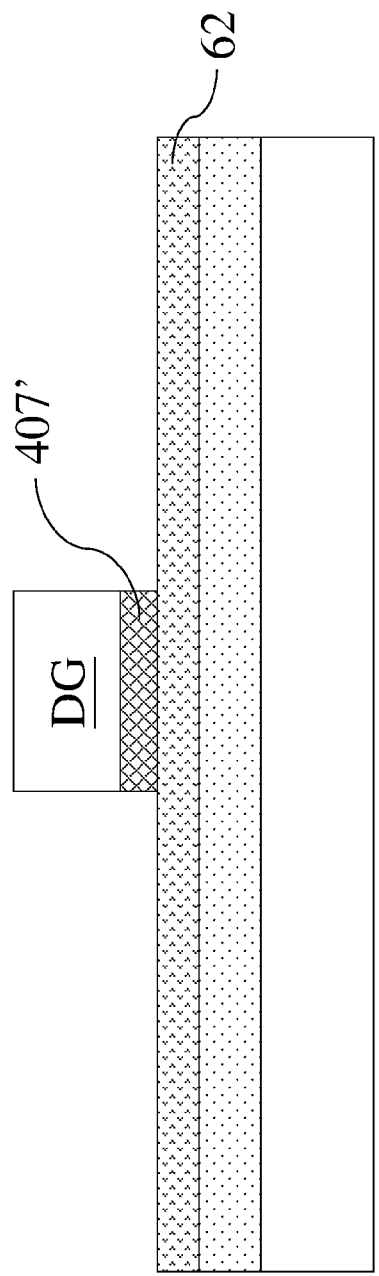
FIG. 11A and FIG. 11B show different stages of a method for manufacturing a semiconductor device according to some embodiments of the present disclosure.
Figure 11B:
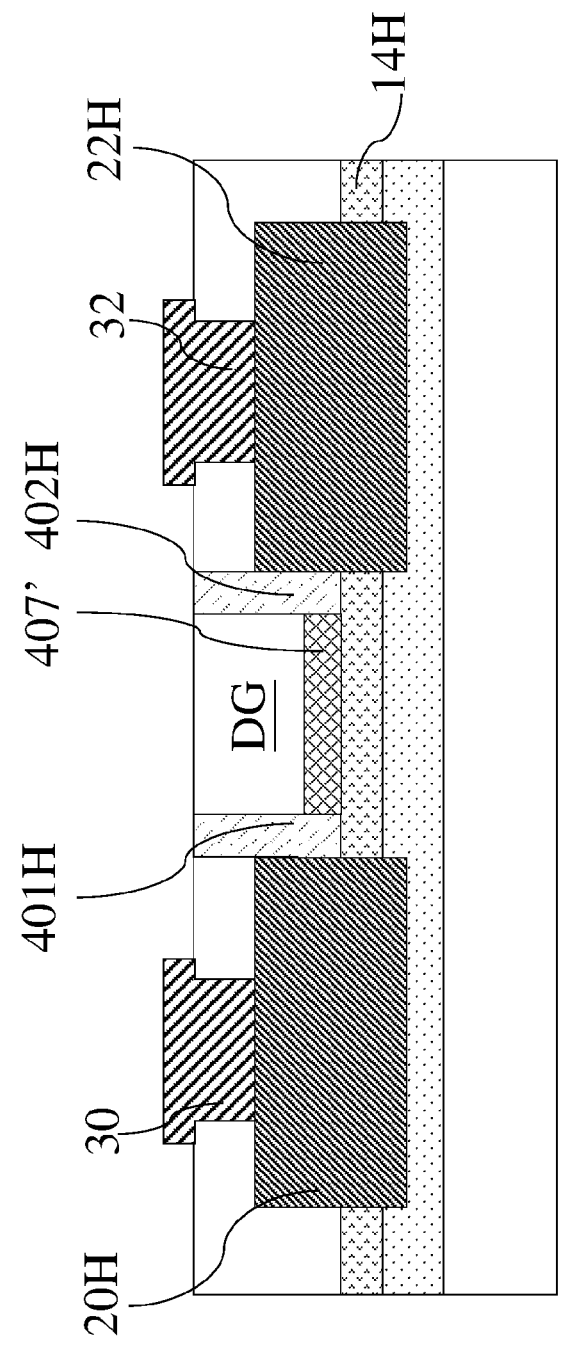

Different stages of a method for manufacturing a semiconductor device are shown in FIG. 11A and FIG. 11B, as described below.

Continuing the manufacturing stage of the FIG. 10A, referring to FIG. 11A, a patterning process is performed on the blanket etching stop layer 70 and the dielectric layer 72, such that the dummy gate DG and the etching stop layer 407' can be formed in a single manufacturing stage. A width of the etching stop layer 407' is formed to be substantially the same as that of the dummy gate DG. Therefore, the manufacturing cost of the semiconductor device can be further reduced.

Referring to FIG. 11B, the nitride-based semiconductor layer 14H, the doped nitride-based semiconductor layers 20H and 22H, the electrodes 30, 32, and the portions 401H and 402H of the gate spacer layer are formed similar to the manufacturing stage of the FIG. 10D, except that the portions 401H and 402H of the gate spacer layer are remained at outer sidewalls of the dummy gate DG and the etching stop layer 407'. The etching stop layer 407' is formed between the portions 401H and 402H of the gate spacer layer.

Figure 12:
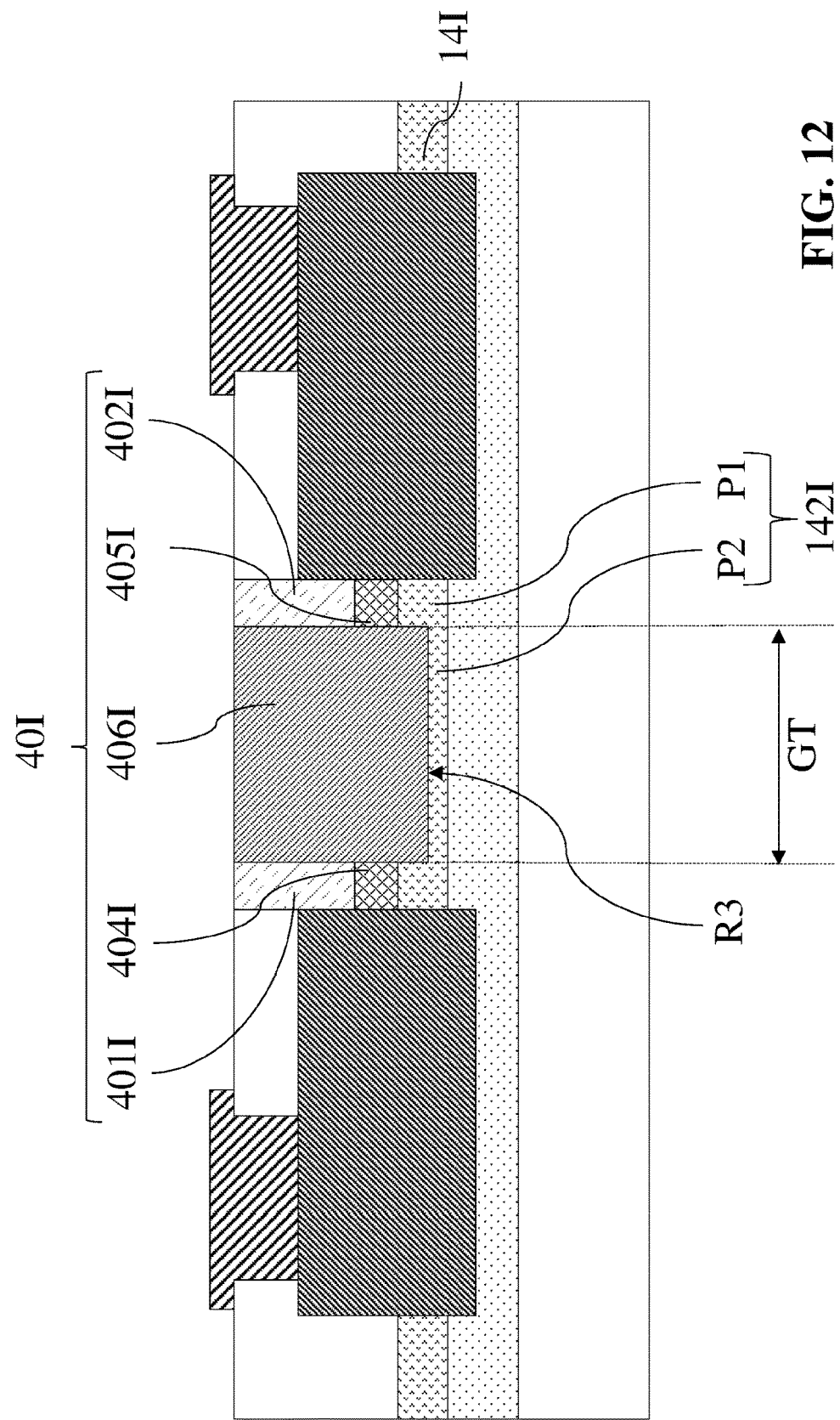
FIG. 12 is a vertical cross-sectional view of a semiconductor device according to some embodiments of the present disclosure.

FIG. 12 is a vertical cross-sectional view of a semiconductor device 1I according to some embodiments of the present disclosure. The semiconductor device 1I is similar to the semiconductor device 1H as described and illustrated with reference to FIG. 9, except that the gate structure 40H can be replaced by a gate structure 40I, and the nitride-based semiconductor layer 14H can be replaced by a nitride-based semiconductor layer 14I.

Referring to FIG. 12, with respect to the semiconductor device 1I, the portion 142I of the nitride-based semiconductor layer 14I can have a recess R3. The portions 142I can have different parts P1, P2 with different thickness, in which the part P1 has a greater thickness than the part P2. The thinner part P2 is located between two thicker parts P1. Thus, a top surface of the part P2 and inner sidewalls of the two parts P1 collectively define a profile of the recess R3.

The portions 404I, 405I of the etching stop layer can be disposed on/over/above the two thicker parts P1 of the portion 142I of the nitride-based semiconductor layer 14I, respectively. The portions 404I, 405I of the etching stop layer can make contact with the two thicker parts P1 of the portion 142I of the nitride-based semiconductor layer 14I, respectively. The portions 401I, 402I of the gate spacer layer can make contact with top surfaces of the portions 404I, 405I of the etching stop layer, respectively. A gate trench GT is collectively defined by inner sidewalls of portions 401I, 402I of the gate spacer layer, the portions 404I, 405I of the etching stop layer and inner sidewalls of the portion 142I (i.e., inner sidewalls of the two thicker parts P2) of the nitride-based semiconductor layer 14I.

The gate electrode 406I is disposed on the thinner part P2 of the portion 142I of the nitride-based semiconductor layer 14I. The gate electrode 406I is disposed in the gate trench GT. The gate electrode 406I extends downward and into the nitride-based semiconductor layer 14I, such that a bottom surface of the gate electrode 406I is in a position lower than bottom surfaces of the portions 404I,405I of the etching stop layer. The bottom surface of the gate electrode 406I is in contact with the thinner part P2 of the portion 142I of the nitride-based semiconductor layer 14I. The bottom surface of the gate electrode 406I is within a thickness of the nitride-based semiconductor layer 14I.

During the manufacturing process of the semiconductor device 1I, the dummy gate DG, a part of the part of the portion P of the blanket etching stop layer 70, and a portion of the blanket nitride-based semiconductor layer 62 are removed, thereby forming a nitride-based semiconductor layer 14I with the recess R3. Then, the bottom portion of the gate electrode 406I can be received by the recess R3.

Figure 13:
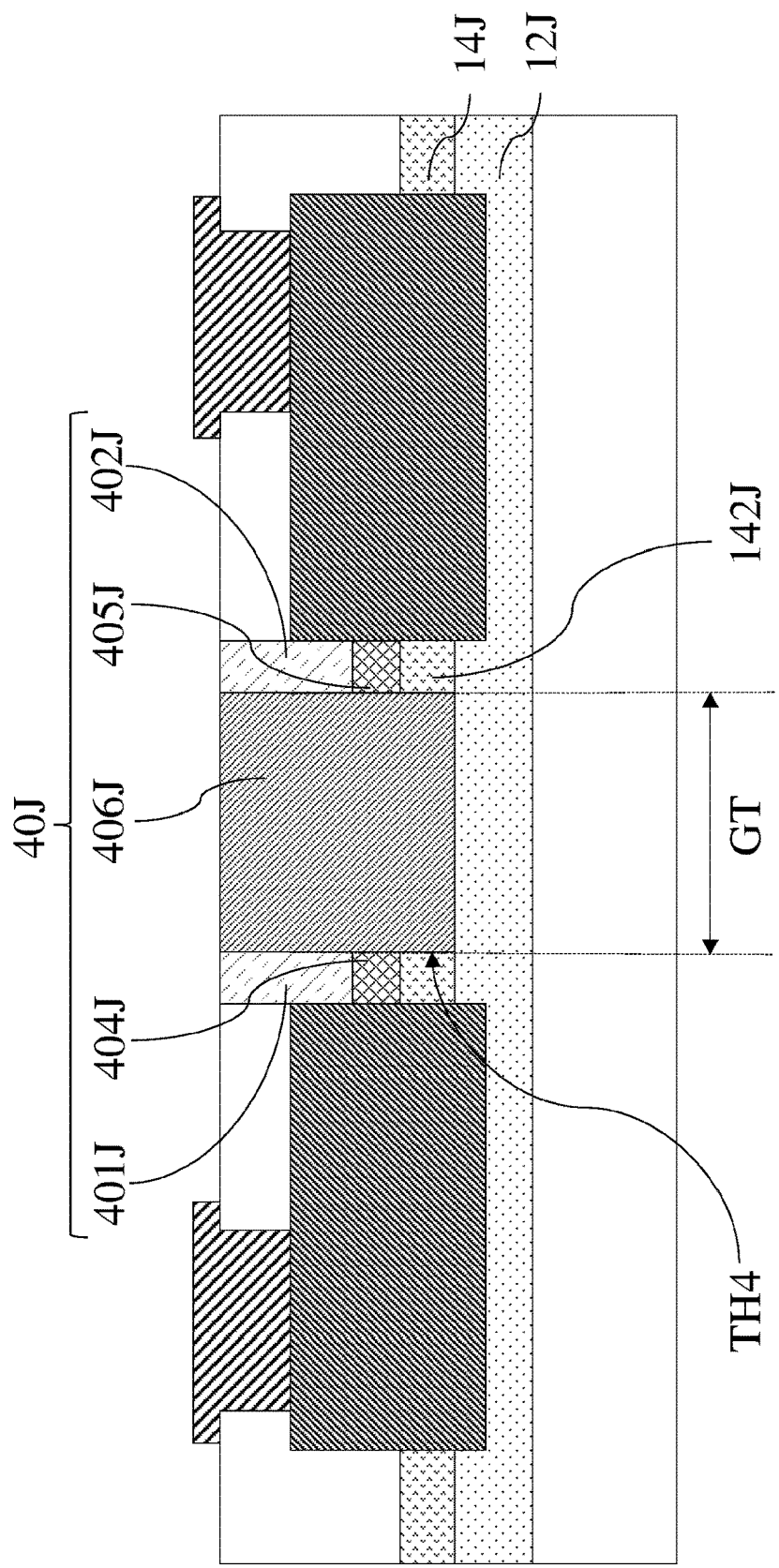
FIG. 13 is a vertical cross-sectional view of a semiconductor device according to some embodiments of the present disclosure.

FIG. 13 is a vertical cross-sectional view of a semiconductor device 1J according to some embodiments of the present disclosure. The semiconductor device 1J is similar to the semiconductor device 1H as described and illustrated with reference to FIG. 9, except that the gate structure 40H can be replaced by a gate structure 40J, and the nitride-based semiconductor layer 14H can be replaced by a nitride-based semiconductor layer 14J.

Referring to FIG. 13, with respect to the semiconductor device 1J, the portion 142J of the nitride-based semiconductor layer 14J can have a through hole TH4. A gate trench GT is collectively defined by inner sidewalls of portions 401J, 402J of the gate spacer layer, inner sidewalls of the portions 404J, 405J of the etching stop layer, and inner sidewalls of the portion 142J of the nitride-based semiconductor layer 14J.

The gate electrode 406J is disposed on/over/over the nitride-based semiconductor layer 12J. The gate electrode 406J is disposed in the gate trench GT. The gate electrode 406J extends downward and into the nitride-based semiconductor layer 14J, such that that a bottom surface of the gate electrode 406J is in a position lower than bottom surfaces of the portion 404J,405J of the etching stop layer. The gate electrode 406J penetrates the nitride-based semiconductor layer 14J through the through hole TH4, such that the bottom surface of the gate electrode 406J is in contact with the nitride-based semiconductor layer 12J.

During the manufacturing process of the semiconductor device 1J, the dummy gate DG, a part of the part of the portion P of the blanket etching stop layer 70, and a portion of the blanket nitride-based semiconductor layer 62 are removed, thereby forming a nitride-based semiconductor layer 14J with the through hole TH4 to expose the top surface of the nitride-based semiconductor layer 12J. The gate trench GT exposing a top surface of the nitride-based semiconductor layer 12J is formed. During the blanket etching stop layer 70 can protect the top surface of the nitride-based semiconductor layer 12J; and thus, the uniformity of the top surface of the nitride-based semiconductor layer 12J (i.e., the channel layer) can be improved. Thereafter, the gate electrode 406J is formed to fill up the gate trench GT to make contact with the nitride-based semiconductor layer 12J.

Figure 14:
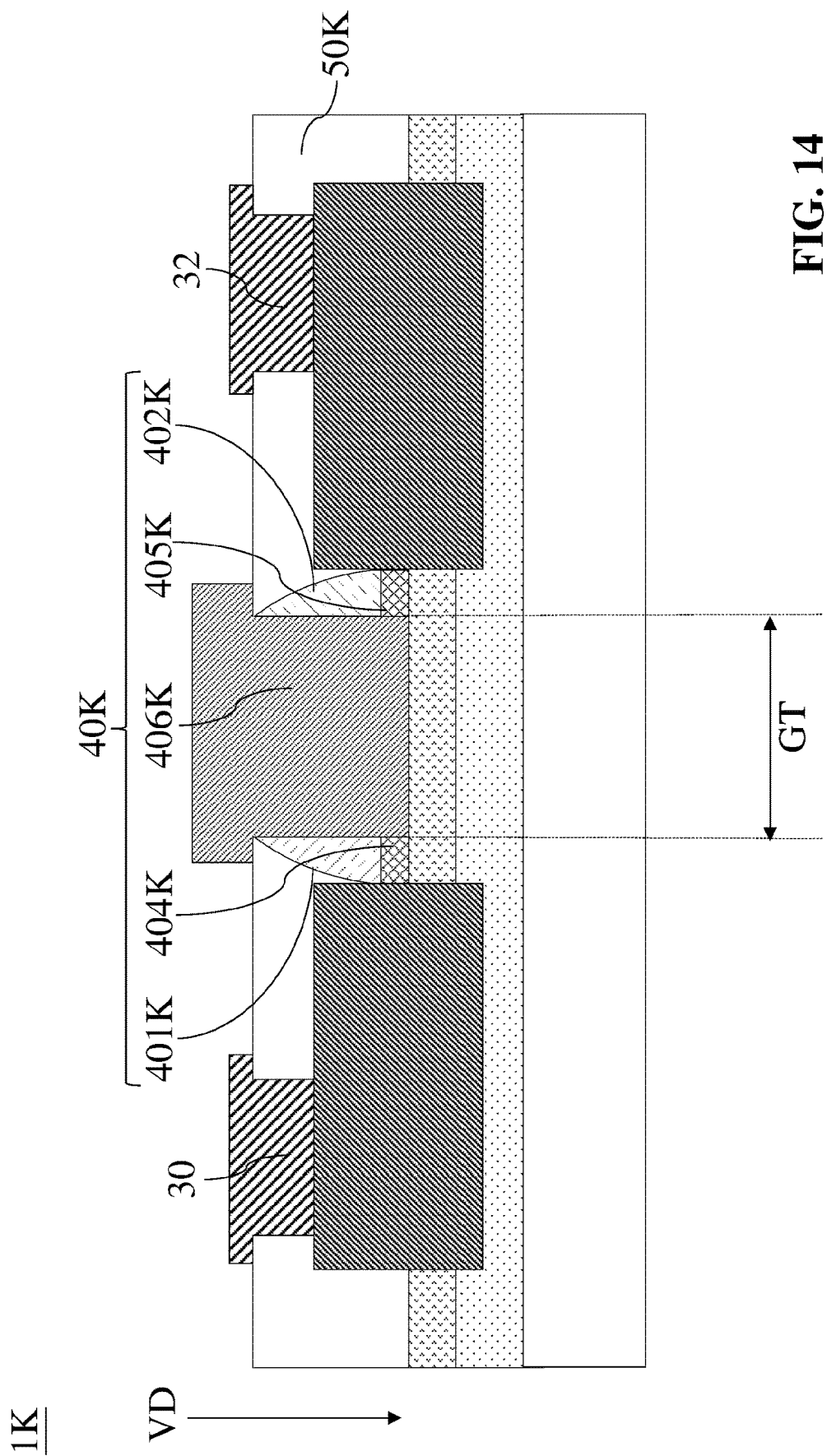
FIG. 14 is a vertical cross-sectional view of a semiconductor device according to some embodiments of the present disclosure.

FIG. 14 is a vertical cross-sectional view of a semiconductor device 1K according to some embodiments of the present disclosure. The semiconductor device 1K is similar to the semiconductor device 1H as described and illustrated with reference to FIG. 9, except that the gate structure 40H can be replaced by a gate structure 40K, and the passivation layer 50 can be replaced by a passivation layer 50K.

Referring to FIG. 14, with respect to the semiconductor device 1K, a width of the portion 401K/402K of the gate spacer layer has a width thereof gradually increasing along a vertical direction VD.

The portion 401K of the gate spacer layer has a curved surface facing toward the electrode 30. The portion 402K of the gate spacer layer has a curved surface facing toward the electrode 32. The curved surfaces of the portions 401K, 402K of the gate spacer layer can evenly distribute the stress from the passivation layer 50K. An interface formed between the portion 401K/402K of the gate spacer layer and the passivation layer 50K is curved. The curved surface can evenly distribute the stress from the passivation layer 50K.

During the manufacturing process of the semiconductor device 1K, each of the portions 401K, 402K of the gate spacer layer can be formed to have a curved surface by tuning at least one parameters, such as the selected etchant, temperature, or pressure.

Figure 15:
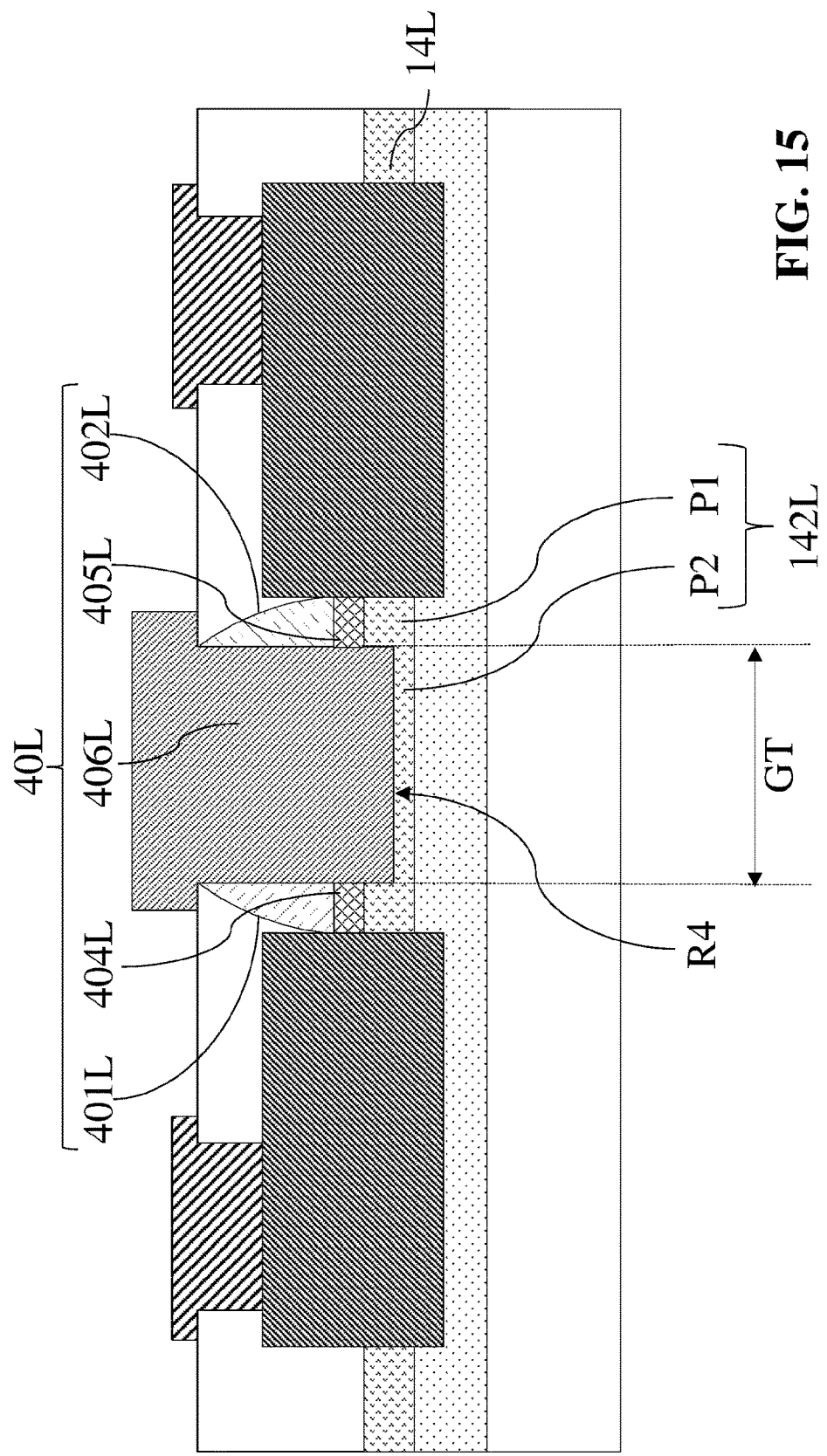
FIG. 15 is a vertical cross-sectional view of a semiconductor device according to some embodiments of the present disclosure.

FIG. 15 is a vertical cross-sectional view of a semiconductor device 1L according to some embodiments of the present disclosure. The semiconductor device 1L is similar to the semiconductor device 1K as described and illustrated with reference to FIG. 14, except that the gate electrode 406K can be replaced by a gate electrode 406L.

Referring to FIG. 15, with respect to the semiconductor device 1L, the portion 142I of the nitride-based semiconductor layer 14I can have a recess R4. The portion 142L can have different parts P1, P2 with different thickness, in which the part P1 has a greater thickness than the part P2. The thinner part P2 is located between two thicker parts P1. Thus, a top surface of the part P2 and inner sidewalls of the two parts P1 collectively define a profile of the recess R4.

The portions 404L, 405L of the etching stop layer can be disposed on/over/above the two thicker parts P1 of the portion 142L of the nitride-based semiconductor layer 14L, respectively. The portions 404L, 405L of the etching stop layer can make contact with the two thicker parts P1 of the portion 142L of the nitride-based semiconductor layer 14L, respectively. The portions 401L, 402L of the gate spacer layer can make contact with top surfaces of the portions 404L, 405L of the etching stop layer, respectively. A gate trench GT is collectively defined by inner sidewalls of portions 401L, 402L of the gate spacer layer, the portions 404L, 405L of the etching stop layer, and inner sidewalls of the portion 142L (i.e., inner sidewalls of the two thicker parts P1) of the nitride-based semiconductor layer 14I.

The gate electrode 406L is disposed on the thinner part P2 of the portion 142L of the nitride-based semiconductor layer 14L. The gate electrode 406L is disposed in the gate trench GT. The gate electrode 406L extends downward and into the nitride-based semiconductor layer 14L, such that a bottom surface of the gate electrode 406L is in a position lower than bottom surfaces of the portions 404L,405L of the etching stop layer. The bottom surface of the gate electrode 406L is in contact with the thinner part P2 of the portion 142L of the nitride-based semiconductor layer 14L. The bottom surface of the gate electrode 406L is within a thickness of the nitride-based semiconductor layer 14L.

During the manufacturing process of the semiconductor device 1L, the dummy gate DG, a part of the part of the portion P of the blanket etching stop layer 70, and a portion of the blanket nitride-based semiconductor layer 62 are removed, thereby forming a nitride-based semiconductor layer 14L with the recess R4. Then, the bottom portion of the gate electrode 406L can be received by the recess R4.

Figure 16:
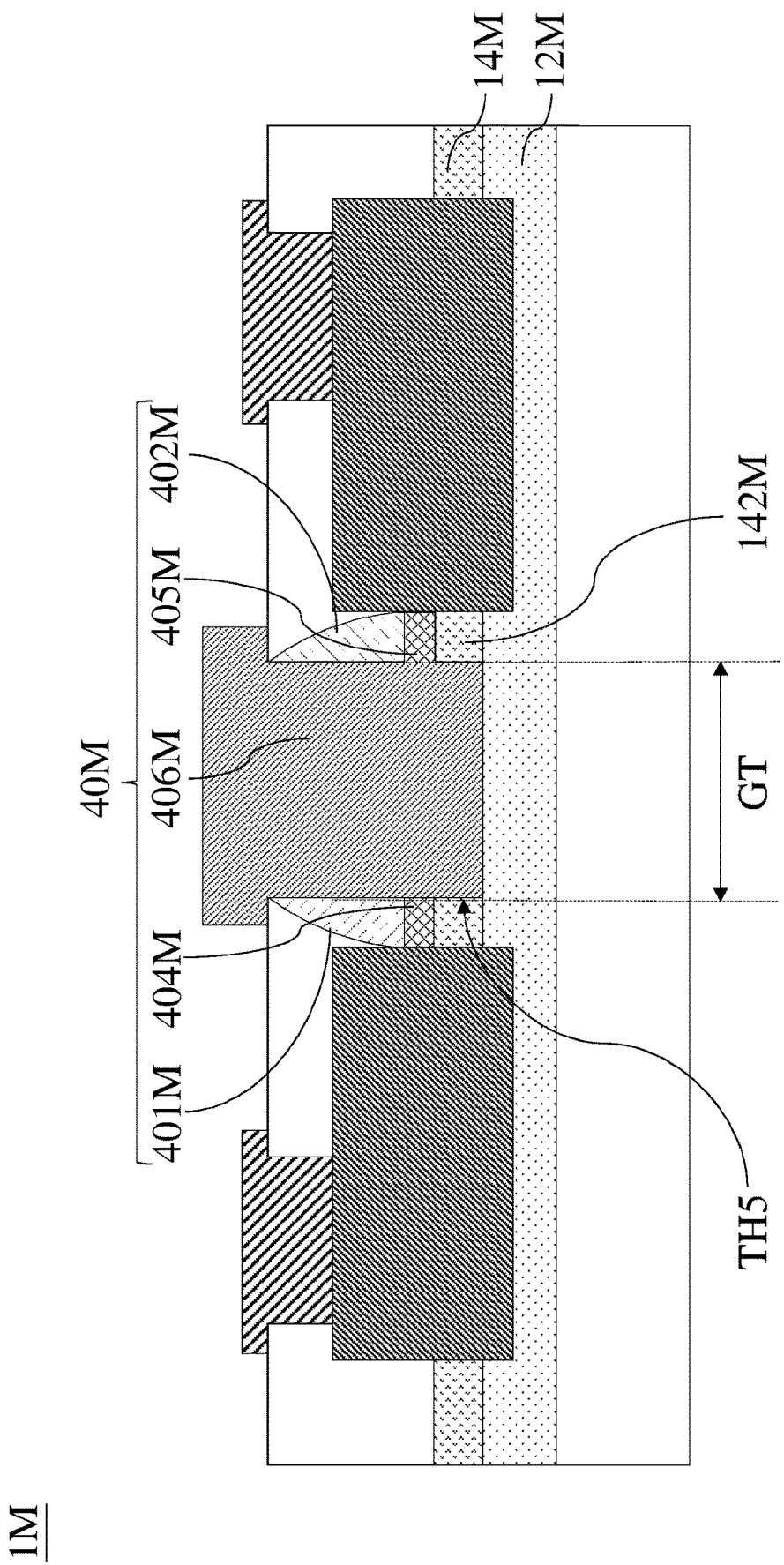
FIG. 16 is a vertical cross-sectional view of a semiconductor device according to some embodiments of the present disclosure.

FIG. 16 is a vertical cross-sectional view of a semiconductor device 1M according to some embodiments of the present disclosure. The semiconductor device 1M is similar to the semiconductor device 1K as described and illustrated with reference to FIG. 14, except that the gate structure 40K can be replaced by a gate electrode 406K. The nitride-based semiconductor layer 14K can be replaced by a nitride-based semiconductor layer 14M.

Referring to FIG. 16, with respect to the semiconductor device 1M, the portion 142M of the nitride-based semiconductor layer 14M can have a through hole TH5. A gate trench GT is collectively defined by inner sidewalls of portions 401M, 402M of the gate spacer layer, inner sidewalls of the portions 404M, 405M of the etching stop layer, and inner sidewalls of the portion 142M of the nitride-based semiconductor layer 14M.

The gate electrode 406M is disposed on/over/over the nitride-based semiconductor layer 12M. The gate electrode 406M is disposed in the gate trench GT. The gate electrode 406M extends downward and into the nitride-based semiconductor layer 14M, such that that a bottom surface of the gate electrode 406M is in a position lower than bottom surfaces of the portion 404M,405M of the etching stop layer. The gate electrode 406M can extend into the through hole TH5 to make contact with a top surface of the nitride-based semiconductor layer 12M.

During the manufacturing process of the semiconductor device 1M, the dummy gate DG, a part of the part of the portion P of the blanket etching stop layer 70, and a portion of the blanket nitride-based semiconductor layer 62 are removed, thereby forming a nitride-based semiconductor layer 14M with the through hole TH5 to expose the top surface of the nitride-based semiconductor layer 12M. The gate trench GT exposing a top surface of the nitride-based semiconductor layer 12M is formed. Thereafter, the gate electrode 406M is formed to fill up the gate trench GT to make contact with the nitride-based semiconductor layer 12M.

Figure 17:
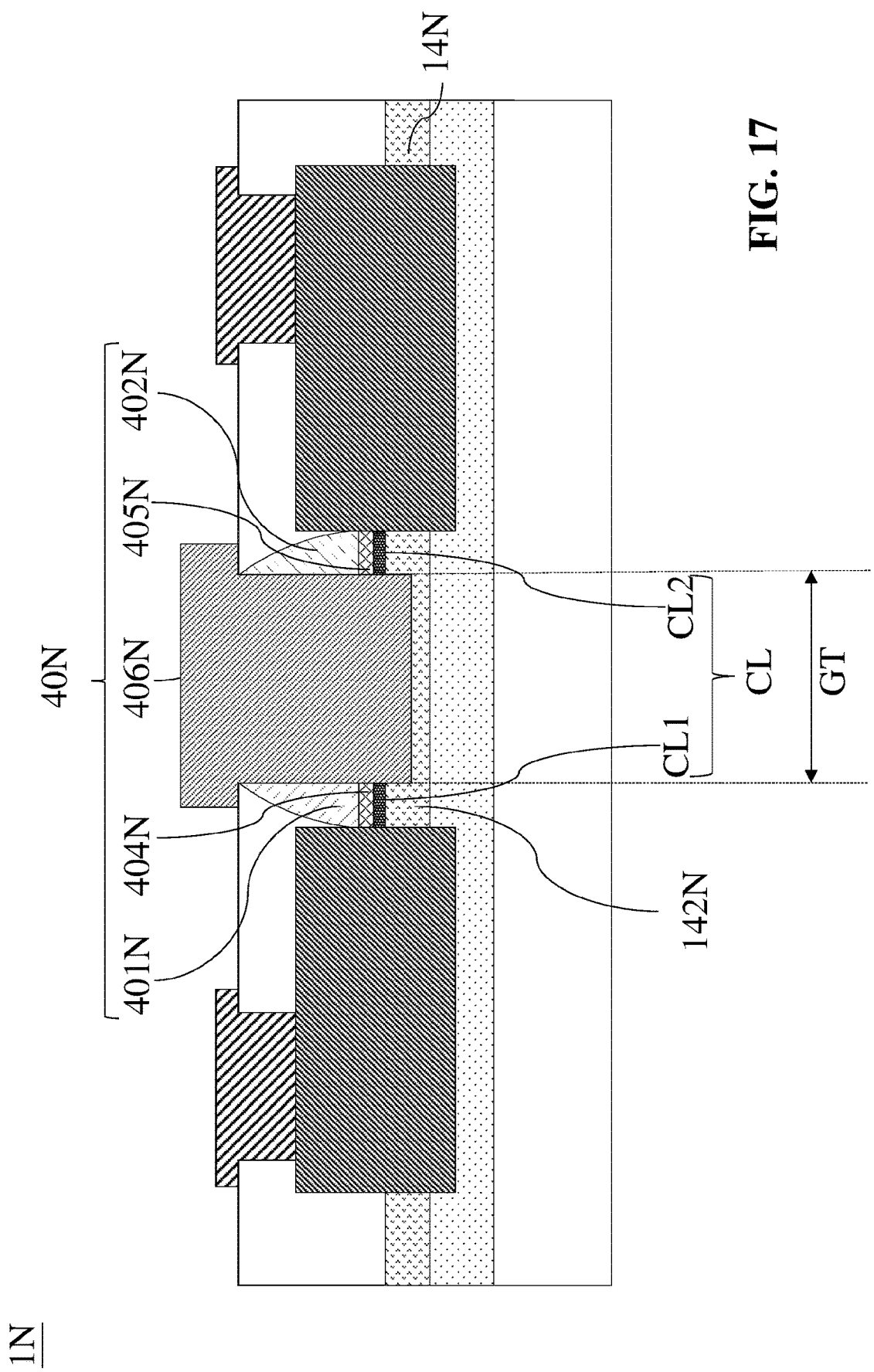
FIG. 17 is a vertical cross-sectional view of a semiconductor device according to some embodiments of the present disclosure.

FIG. 17 is a vertical cross-sectional view of a semiconductor device 1N according to some embodiments of the present disclosure. The semiconductor device 1N is similar to the semiconductor device 1H as described and illustrated with reference to FIG. 16, except that the gate structure 40M can be replaced by a gate structure 40N, and the semiconductor device 1G further includes a capping layer CL. The capping layer CL includes two separated portions CL1, CL2.

Referring to FIG. 17, with respect to the semiconductor device 1N, the portion CL1 of the capping layer CL is disposed between the portion 401N of the gate spacer layer and the portion 142N of the nitride-based semiconductor layer 14N. The portion CL2 of the capping layer CL is disposed between the portion 402N of the outer spacer and the portion 142N of the nitride-based semiconductor layer 14N. Widths of the portion CL1, CL2 of the capping layer CL are substantially the same as widths of bottom end surfaces of the portions 401N, 402N of the outer spacer, respectively. The portions CL1, CL2 of the capping layer CL abuts against with the gate electrode 406N, respectively.

A gate trench GT is collectively defined by inner sidewalls of portions 401N, 402N of the gate spacer layer, the portions 404N, 405N of the etching stop layer, the portions CL1, CL2 of the capping layer CL, and the portions 142N of the nitride-based semiconductor layer 14N. The portion 404N of the etching stop layer is disposed between the portion 401N of the gate spacer layer and the portion CL1 of the of the capping layer CL. The portion 405N of the etching stop layer is disposed between the portion 402N of the gate spacer layer and the portion CL2 of the capping layer CL.

The exemplary materials of the capping layer CL can be, dielectric materials. For example, the dielectric materials can include, for example but are not limited to, $SiN_x$, $SiO_x$, $Si_3N_4$, SiON, SiC, SiBN, SiCBN, oxides, nitrides, plasma enhanced oxide (PEOX), or combinations thereof.

During the manufacturing process of the semiconductor device 1N, the blanket capping layer (not shown) is formed between the blanket nitride-based semiconductor layer 62 and the blanket etching stop layer 70. Then, a portion of the blanket capping layer, a portion of the blanket etching stop layer 70 and the dummy gate DG are removed, such that two separated portions of the blanket capping layer (i.e., the portions CL1, CL2 of the capping layer CL) are remained under the portions 404N, 405N of the etching stop layer 407N.

By the above configuration, in the present disclosure, by filling/introducing an inner spacer in the gate trench of the gate structure in advanced and forming the gate electrode in the gate trench after the formation of the inner spacer, gate length of the gate electrode can be naturally smaller than a width of the gate trench. Therefore, the semiconductor device can satisfy high frequency requirement. Moreover, an effect of reducing channel length without using expensive equipment can be achieved, and the electrical properties of the semiconductor device can be improved. Moreover, the manufacturing cost of the semiconductor device can be greatly reduced.

On the other hand, in the present disclosure, by introducing at least one etching stop layer in the gate structure, the formation of the gate trench of the gate structure at least includes two etching processes due to the existence of the etching stop layer. The etching stop layer can stop the first etching process effectively due to its chemical/physical properties; and therefore, the probability of occurring an over-etched issue will decreased. Thus, the reliability and performance of the semiconductor device can be improved.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A semiconductor device, comprising:
a first nitride-based semiconductor layer;
a second nitride-based semiconductor layer disposed over the first nitride-based semiconductor layer, wherein the second nitride-based semiconductor layer has a bandgap greater than that of the first nitride-based semiconductor layer; and
a gate structure disposed over the first nitride-based semiconductor layer, wherein the gate structure comprises:
an outer spacer disposed over the second nitride-based semiconductor layer and having at least two opposite inner sidewalls to define a gate trench;
an inner spacer disposed over the first nitride-based semiconductor layer and within the gate trench; and
a gate electrode disposed in the gate trench and covered by the inner spacer, wherein the at least inner spacer and the gate electrode extend downward to collaboratively form a bottom portion of the gate structure with a first width greater than a second width of a bottom surface of the gate electrode,
wherein the semiconductor device further comprises a doped nitride-based semiconductor layer at least abutting against the outer spacer, wherein an entirety of a bottom surface of the doped nitride-based semiconductor layer is in a position under the inner spacer.

2. The semiconductor device of claim 1, wherein the inner spacer extends downward to a position beneath an entirety of the outer spacer.

3. The semiconductor device of claim 1, wherein an entirety of the inner sidewall of the outer spacer is covered by the inner spacer.

4. The semiconductor device of claim 1, wherein the inner spacer has a bottom end surface in contact with the second nitride-based semiconductor layer.

5. The semiconductor device of claim 4, wherein the bottom end surface of the inner spacer is in a position within a thickness of the second nitride-based semiconductor layer.

6. The semiconductor device of claim 1, wherein the inner spacer has a bottom end surface in contact with the first nitride-based semiconductor layer.

7. The semiconductor device of claim 1, wherein the gate electrode and the outer spacer layer are separated from each other by the inner spacer.

8. The semiconductor device of claim 1, wherein the inner spacer comprises two portions separated from each other, and the gate electrode is located between the portions of the inner spacer and is wider than each of the portions of the inner spacer.

9. The semiconductor device of claim 1, wherein the second nitride-based semiconductor layer has a recess receiving the bottom portion of the gate structure.

10. The semiconductor device of claim 1, wherein the inner spacer comprises two portions separated from each other and having a width that is substantially constant.

11. The semiconductor device of claim 1, wherein a width of the inner spacer gradually increases along a vertical direction.

12. The semiconductor device of claim 1, wherein an interface formed between the inner spacer and the gate electrode is curved.

13. The semiconductor device of claim 1, wherein the inner spacer has a downward extending length greater than a thickness of the outer spacer.

14. The semiconductor device of claim 1, further comprising:
a capping layer disposed between the outer spacer and the second nitride-based semiconductor layer and abutting against with the inner spacer.

15. A manufacturing method of a semiconductor device, comprising:
forming a first nitride-based semiconductor layer;
forming a second nitride-based semiconductor layer over the first nitride-based semiconductor layer, wherein the second nitride-based semiconductor layer has a bandgap greater than that of the first nitride-based semiconductor layer;

forming a dummy gate on the second nitride-based semiconductor layer;

forming a blanket spacer layer to cover the dummy gate;

removing a portion of the blanket spacer layer to expose the dummy gate, wherein at least a portion of the blanket spacer layer is remained at an outer sidewall of the dummy gate to serve as an outer spacer;

removing the dummy gate to form a gate trench;

forming an inner spacer in the gate trench;

forming a gate electrode in the gate trench, such that a width of a bottom portion of the gate electrode is less than a width of the gate trench.

16. The manufacturing method of claim 15, wherein the gate trench exposes a portion of the first nitride-based semiconductor layer.

17. The manufacturing method of claim 15, wherein the inner spacer has a width gradually increasing along a vertical direction.

18. The manufacturing method of claim 15, wherein the inner spacer is formed to have a curved surface.

19. The manufacturing method of claim 15, wherein the dummy gate is wider than the gate electrode.

* * * * *